(12) United States Patent
Mita

(10) Patent No.: US 10,003,410 B2
(45) Date of Patent: Jun. 19, 2018

(54) OPTICAL RECEIVER, OPTICAL TERMINATION DEVICE, AND OPTICAL COMMUNICATION SYSTEM

(71) Applicant: Mitsubishi Electric Corporation, Chiyoda-ku (JP)

(72) Inventor: Daisuke Mita, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days. days.

(21) Appl. No.: 15/507,924

(22) PCT Filed: Apr. 15, 2015

(86) PCT No.: PCT/JP2015/061579
§ 371 (c)(1),
(2) Date: Mar. 1, 2017

(87) PCT Pub. No.: WO2016/035374
PCT Pub. Date: Mar. 10, 2016

(65) Prior Publication Data
US 2017/0294970 A1    Oct. 12, 2017

(30) Foreign Application Priority Data

Sep. 3, 2014 (WO) .................. PCT/JP2014/073238

(51) Int. Cl.
*H04B 10/06* (2006.01)
*H04B 10/61* (2013.01)
(Continued)

(52) U.S. Cl.
CPC ......... *H04B 10/616* (2013.01); *H03G 3/3089* (2013.01); *H04B 10/611* (2013.01);
(Continued)

(58) Field of Classification Search
CPC ................ H04B 10/611; H04B 10/693; H04B 10/6931; H04B 10/6933; H04B 10/6911;
(Continued)

(56) References Cited

U.S. PATENT DOCUMENTS 6,342,694 B1   1/2002 Satoh
2009/0142074 A1   6/2009 Ide
(Continued)

FOREIGN PATENT DOCUMENTS

JP   8-256119 A    10/1996
JP   11-261482 A    9/1999
(Continued)

OTHER PUBLICATIONS

International Search Report dated Jun. 30, 2015 in PCT/JP2015/061579 filed Apr. 15, 2015.

*Primary Examiner* — Hanh Phan
(74) *Attorney, Agent, or Firm* — Oblon, McClelland, Maier & Neustadt, L.L.P.

(57) ABSTRACT

An optical receiver includes an APD that converts an input optical signal into a current signal, a TIA that converts the current signal output from the APD into a voltage signal, an LIA that shapes a waveform of the voltage signal output from the TIA, an AOC having a time constant switching function, the AOC automatically compensating for an offset voltage between differential outputs from the TIA, and a convergence-state detection circuit that outputs, after detecting convergence completion of the automatic compensation in the AOC, to the AOC, a time constant switching control signal for switching a time constant from a high-speed time constant to a low-speed time constant.

20 Claims, 27 Drawing Sheets

(51) Int. Cl.
*H04B 10/69* (2013.01)
*H03G 3/30* (2006.01)
*H04L 7/027* (2006.01)

(52) U.S. Cl.
CPC ....... *H04B 10/615* (2013.01); *H04B 10/6165* (2013.01); *H04B 10/69* (2013.01); *H04B 10/6911* (2013.01); *H04L 7/027* (2013.01)

(58) Field of Classification Search
CPC .. H04B 10/69; H04B 10/697; H04B 10/6165; H04B 10/616; H03G 3/3084; H03F 3/08
USPC ....... 398/202, 208, 209, 204, 205, 206, 207, 398/210, 212, 213, 214, 135, 136, 70, 71, 398/72; 330/59, 308; 250/214 A, 250/214 AG, 214 LA See application file for complete search history.

(56) References Cited

U.S. PATENT DOCUMENTS

| | | | |
|---|---|---|---|
| 2010/0067924 A1* | 3/2010 | Noda | H03G 3/3084 398/202 |
| 2014/0010556 A1* | 1/2014 | Yoshima | H04B 10/272 398/212 |

FOREIGN PATENT DOCUMENTS

| | | |
|---|---|---|
| JP | 2000-68945 A | 3/2000 |
| JP | 2007-274032 A | 10/2007 |
| JP | 2008-148321 A | 6/2008 |
| JP | 2009-49488 A | 3/2009 |
| JP | 2009-135849 A | 6/2009 |
| JP | 2009-246535 A | 10/2009 |
| JP | 2010-178256 A | 8/2010 |
| JP | 2010-278753 A | 12/2010 |
| JP | 2011-91688 A | 5/2011 |
| WO | WO 2008/075430 A1 | 6/2008 |

* cited by examiner

OPTICAL RECEIVER, OPTICAL TERMINATION DEVICE, AND OPTICAL COMMUNICATION SYSTEM

FIELD

The present invention relates to an optical receiver that receives an optical signal, an optical termination device including the optical receiver, and an optical communication system including the optical termination device.

BACKGROUND

In recent years, in an access network for providing a multimedia service to homes, a point-to-multi-point access optical communication system called PON (Passive Optical Network) system realized by a public circuit network using an optical fiber is widely used.

The PON system is configured from one OLT (Optical Line Terminal), which is an optical termination device of a station-side apparatus, and ONUs (Optical Network Units), which are a plurality of subscriber-side terminal devices, connected via an optical star coupler.

Light reception levels of optical signals received by the OLT from the ONUs depend on the distances between the ONUs, which are transmission sources of the optical signals, and the OLT. However, the distances between the OLT and the ONUS are not the same concerning all of the ONUs. Therefore, an optical receiver used in the OLT is required to have a wide dynamic range characteristic for stably reproducing packets having different light reception levels. To realize the wide dynamic range characteristic, in general, a preamplifier mounted on the optical receiver includes an AGC (Automatic Gain Control) circuit.

In the PON system, while a certain GNU is transmitting a packet, the other ONUs cannot transmit packets. To improve transmission efficiency, time among the packets needs to be reduced. A specific bit called preamble is stored in the head of the packet transmitted from the ONU. The preamble is used for synchronization. To improve the transmission efficiency, a short preamble has to be used to receive the following payload in synchronization with the preamble. Therefore, the AGC circuit included in the preamplifier is required to have a high-speed burst reception characteristic for completing AGC convergence at high speed using the short preamble.

However, the optical receiver including the preamplifier is required to have, simultaneously with the high-speed burst reception characteristic, high identical code succession tolerance capable of stably performing reception even during identical code succession bit input. In general, the high-speed burst reception characteristic and the identical code succession tolerance are in a tradeoff relation. It is difficult to achieve both of the high-speed burst reception characteristic and the identical code succession tolerance.

As the optical receiver of the OLT, some optical receiver includes an AOC (Auto-Offset Control: auto-offset voltage adjustment or auto-offset compensation) circuit that compensates for an offset voltage between input burst signals or differential output signals of an internal differential amplification circuit. Like the AGC circuit, the ACC circuit is required to have both of the high-speed burst reception characteristic and the identical code succession tolerance. That is, voltage control circuits such as the AOC circuit and the AGC circuit in the optical receiver of the OLT are required to have both of the high-speed burst reception characteristic and the identical code succession tolerance.

Therefore, Patent Literature 1 and Patent Literature 2 disclose control schemes for switching a tame constant. In Patent Literature 1 described below, an amplification circuit includes an AOC circuit that compensates for an offset voltage of an input burst signal and outputs the offset voltage on the basis of an offset voltage detected and retained at a time constant variably controlled by a time constant control signal, a pulse detection circuit that detects presence or absence of a pulse from the burst signal and outputs a pulse detection signal; and a time-constant control circuit that outputs, on the basis of the pulse detection signal, to the AOC circuit, a time constant control circuit for reducing, that is, shortening the time constant in a pulse detection section and increasing, that is, lengthening the time constant in a pulse non-detection section. The amplification circuit includes an LIA (Limiting Amplifier) that is connected to, for example, a post stage of a preamplifier and amplifies and limits the burst signal to have constant amplitude.

For example, when there is offset between differential signals input to the LIA, the burst signal is amplified and limited while the offset voltage is kept applied to the burst signal. Therefore, the offset voltage affects an output burst signal of the LIA in a form of waveform distortion and deteriorates waveform quality. Therefore, as described in Patent Literature 1 described below, in general, the amplification circuit includes the AOC circuit. A time constant switching scheme for achieving both of the high-speed burst reception characteristic and the identical code succession tolerance is used. The amplification circuit described in Patent Literature 1 described below detects presence or absence of a pulse and is controlled to reduce the time constant in the pulse detection section to make it possible to output an output burst signal having a stable waveform in a short time and, on the other hand, is controlled to increase the time constant in the pulse non-detection section and can suppress fluctuation in a control signal of the AOC circuit even in a section in which identical code bits are consecutively input.

In Patent Literature 2 described below, a time constant switching scheme same as the time constant switching scheme in the Patent Literature 1 described below is applied in an amplification circuit. When there is a voltage signal output from the LIA, the time constant of the AOC circuit is set to a small value to improve initial response speed of feedback compensation. On the other hand, when there is no voltage signal output from the LIA, the time constant is increased to suppress baseline fluctuation of a signal even if identical code bits are consecutively received. An eye aperture can be increased and stability is improved. In Patent Literature 1 described below, time constant control is realized by using the pulse detection circuit. In Patent Literature 2 described below, the time constant control is realized by using a signal detector (SD) that detects a voltage signal output from the LIA.

CITATION LIST

Patent Literature

Patent Literature 1: Japanese Patent Application Laid-Open No. 2009-246535
Patent Literature 2: Japanese Patent Application Laid-Open No. 2010-178256.

SUMMARY

Technical Problem

However, according to the conventional technologies, in the optical receiver, it is likely that switching timing of the time constant shifts because of a malfunction. The malfunction means that, in the optical receiver, switching of the time constant of the voltage control circuit from a small time constant to a large time constant is not performed at appropriate timing with respect to control operation of the voltage control circuit. For example, after the control operation of the voltage control circuit is started at the small time constant, when the switching to the large time constant is performed before the control operation converges, control by the voltage control circuit at the small time constant sometimes cannot exhibit desired performance. Therefore, when the switching of the time constant is not performed at appropriate timing with respect to the control operation of the voltage control circuit, there is a problem in that the control by the voltage control circuit is insufficient, waveform distortion remains in a reception waveform output as a signal after the control, and normal reproduction of the reception waveform cannot be performed.

The present invention has been devised in view of the above and an object of the present invention is to obtain an optical receiver, an optical termination device, and an optical communication system that can suppress waveform distortion in a reception waveform.

Solution to Problem

To solve the problems and achieve the object, an optical receiver according to the present invention includes: a photocurrent conversion element to convert an input optical signal into a current signal; an amplifier to convert the current signal output from the photocurrent conversion element into a voltage signal; and a voltage control circuit having a time constant switching function, the voltage control circuit generating an output signal for controlling the voltage signal. Further, the optical receiver includes a detection circuit to, after detecting convergence completion of the voltage control circuit on the basis of the output signal, output, to the voltage control circuit, a time constant switching control signal for switching a time constant of the voltage control circuit from a first time constant to a second time constant larger than the first time constant.

Advantageous Effects of Invention

The optical receiver, the optical termination device, and the optical communication system according to the present invention achieves an effect that it is possible to suppress waveform distortion in a reception waveform.

DESCRIPTION OF EMBODIMENTS

Embodiments of an optical receiver, an optical termination device, and an optical communication system according to the present invention are explained in detail below with reference to the drawings. Note that the present invention is not limited by the embodiments.

First Embodiment

First, the operations of a conventional optical receiver at the time when switching of a time constant is normally performed and at the time when the switching of the time constant is not normally performed because of a malfunction are briefly explained.

Figure 1:
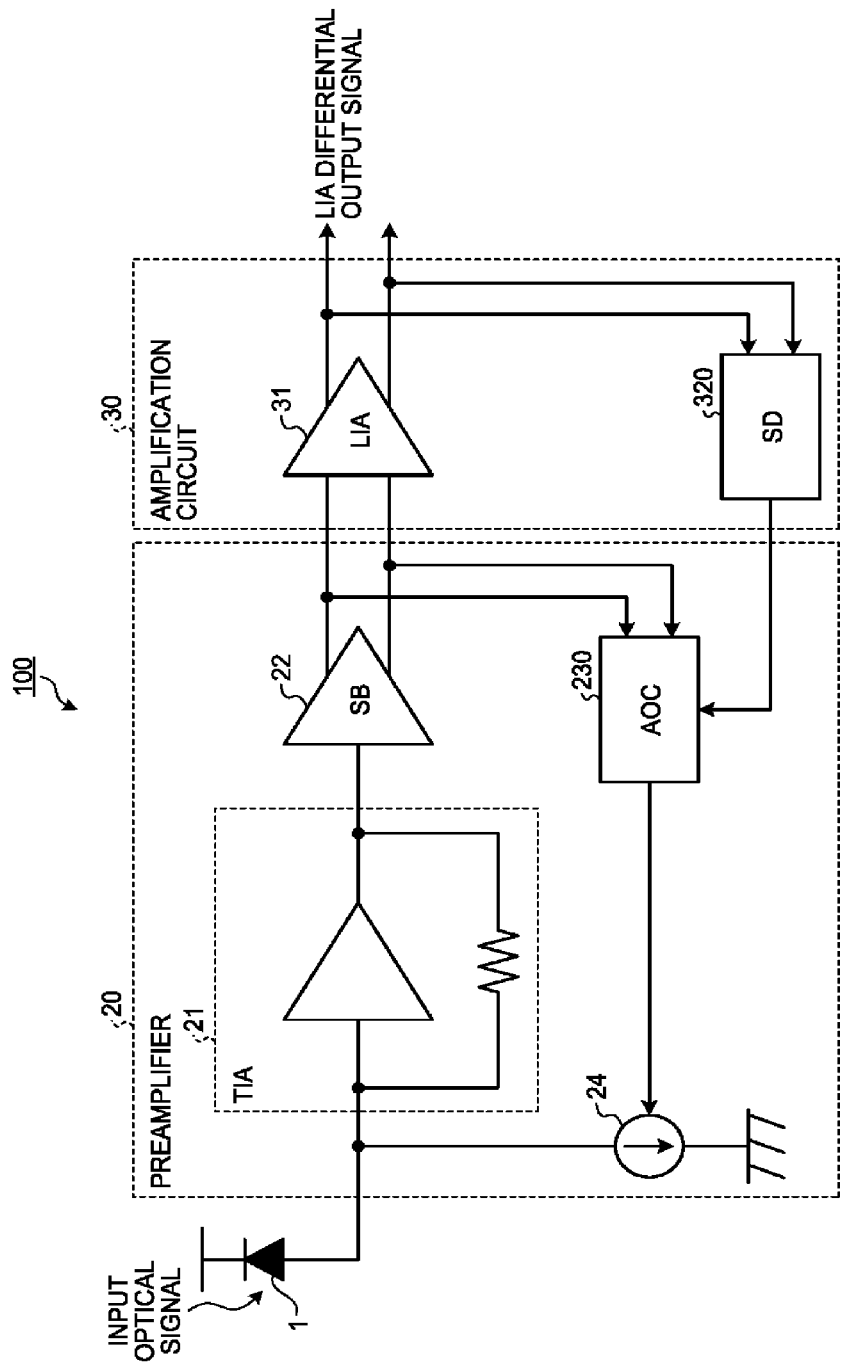
FIG. 1 is a block diagram showing an example of a circuit configuration of a conventional optical receiver.

FIG. 1 is a block diagram showing an example of a circuit configuration of a conventional optical receiver 100. In FIG. 1, a block diagram of the optical receiver shown in FIG. 1 of Patent Literature 2 described above is simplified and shown. In FIG. 1, a part of components shown in FIG. 1 of Patent Literature 2 described above is omitted. In Patent Literature 2, it is assumed that the optical receiver 100 applied with a time constant switching scheme is mounted on an OLT and receives an optical signal from an ONU that configures an optical communication system in conjunction with the OLT. The optical receiver 100 performs, in an APD (Avalanche Photo Diode) 1, photocurrent conversion on the optical signal received from the ONU. The optical receiver 100 includes a TIA (Trans Impedance Amplifier) 21 that converts a current signal from the APD 1 into a voltage signal and outputs the voltage signal to receive packets having different reception levels, an SB (Signal to Balanced converter) 22 that converts a single-phase output signal, which is a voltage signal of a single phase output from the TIA 21, into differential output signals and outputs the differential output signals, an AOC 230 including an integrator that integrates the differential output signals output from the SB 22, the AOC 23 performing control to extract, with a current source 24, a direct current output from the APD 1 to reduce a voltage difference between the differential output signals to zero on the basis of an integration result, and the current source 24 that extracts the current signal output from the APD 1. Note that the AOC 230 is correctly an auto-offset compensation circuit, that is, an AOC circuit. However, in the explanation concerning the optical receiver 100, the AOC circuit is referred to as AOC 230 according to Patent Literature 2. The AOC 230 adopts a scheme including the integrator. However, this is an example and the AOC 230 is not limited to this. In addition, the AOC 230 is incorporated in a preamplifier 20. However, the AOC 230 can be provided on the outside. This is an example and the AOC 230 is not limited to this.

Further, the optical receiver 100 includes an LIA 31 that shapes a waveform of the differential output signals output from the SB 22 and outputs the differential output signals, the waveform of which is shaped, to a not-shown CDR (Clock Data Recovery) circuit in a post stage and the like and an SD 320 that detects presence or absence of the differential output signals output from the LIA 31 and outputs an SD signal indicating a detection result. Note that the SD 320 is present on the inside of the amplification circuit 30 and generates the SD signal on the basis of the differential output signals output from the LIA 31. However, this is an example and the SD 320 is not limited to this.

Figure 2:
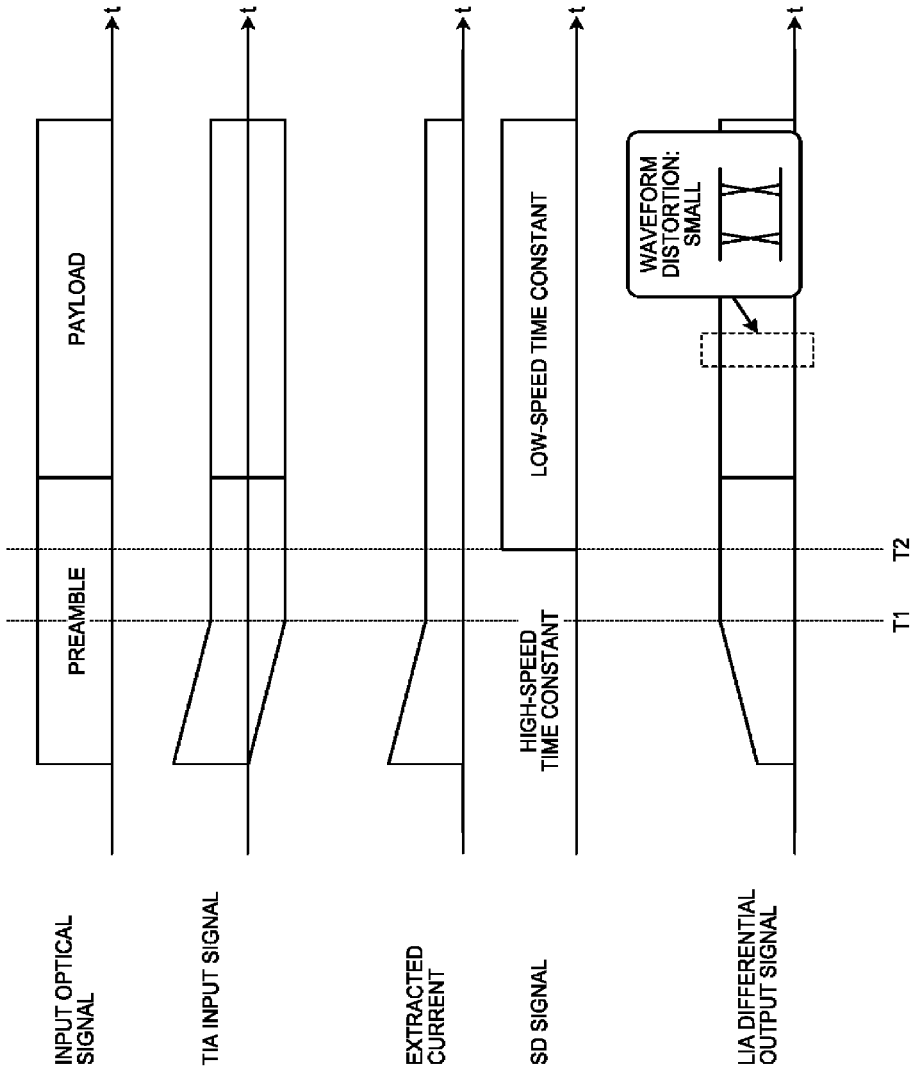
FIG. 2 is a timing chart showing operation during packet input of the conventional optical receiver.

FIG. 2 is a timing chart showing operation during packet input of the conventional optical receiver 100. In FIG. 2, input signals or output signals of blocks assumed in the optical receiver described in Patent Literature described above are schematically shown. In the first stage of FIG. 2, a packet input to the APD 1 as an optical signal, that is, an input optical signal to the APD 1 is shown. In the second stage of FIG. 2, an input signal to the LIA 21 is shown. In the third stage of FIG. 2, an extracted current extracted by the current source 24 is shown. In the fourth stage of FIG. 2, an SD signal output from the SD 320 is shown. In the fifth stage of FIG. 2, a positive-phase signal of differential outputs output from the LIA 31 is shown. A small, that is, short time constant, which is a first time constant, is represented as a high-speed time constant. A second time constant, which is a time constant larger, that is, longer than the high-speed time constant is represented as low-speed time constant. The horizontal axis of FIG. 2 indicates time t. When the differential output signals output from the LIA 31 are not detected, the optical receiver 100 shown in FIG. 1 uses the high-speed time constant as a time constant of the AOC 230, that is, a time constant in the integrator of the AOC 230. On the other hand, when the differential output signals output from the LIA 31 are detected, the optical receiver 100 uses the low-speed time constant as the time constant of the AOC 230.

When an optical signal having a preamble and a payload is input to the optical receiver 100, the AOC 230 integrates the differential output signals from the SF 22 and controls the current source 24 to reduce a difference between the differential output signals to zero on the basis of an integration result. Before the optical signal is input to the APD 1, the SD 320 does not detect the differential output signals output from the LIA 31. Therefore, in FIG. 2, at a point in time when the input of the optical signal is started, the time constant of the AOC 230 is the high-speed time constant. The AOC 230 controls the current source 24 at high speed. The current source 24 extracts, according to the control by the AOC 230, a direct current from a current signal output from the APD 1, whereby an offset voltage, which is a difference between the differential output signals output from the SB 22, is cancelled, that is, compensated. Therefore, are offset voltage, which is a difference between the differential output signals input to the LIA 31, is cancelled. It is possible to output a normal waveform having small reception waveform distortion from the LIA 31.

After convergence time T1, which is time when AOC converging operation is completed, that is, the control by the AOC 230 converges, the SD 320 detects the differential output signals output from the LIA 31 and outputs an SD signal at time T2. That is, at time T2, the SD signal is switched from a value indicating that the differential output signals output from the LIA 31 are not detected to a value indicating that the differential output signals output from the LIA 31 are detected. The AOC 230 switches the time constant from the high-speed time constant to the low-speed time constant on the basis of the SD signal. Consequently, in the optical receiver 100, even when noise or fluctuation occurs between packets and when CID (Consecutive Identical Digit) pattern data, in which identical code bits are consecutive, is input, it is possible to maintain a stable output signal of the AOC 230. It is possible to minimize the influence on the offset compensation and realize high identical code succession tolerance. According to the operation explained above, in the optical receiver 100, it is possible to achieve both of the high-speed burst reception characteristic and the identical code succession tolerance.

Figure 3:
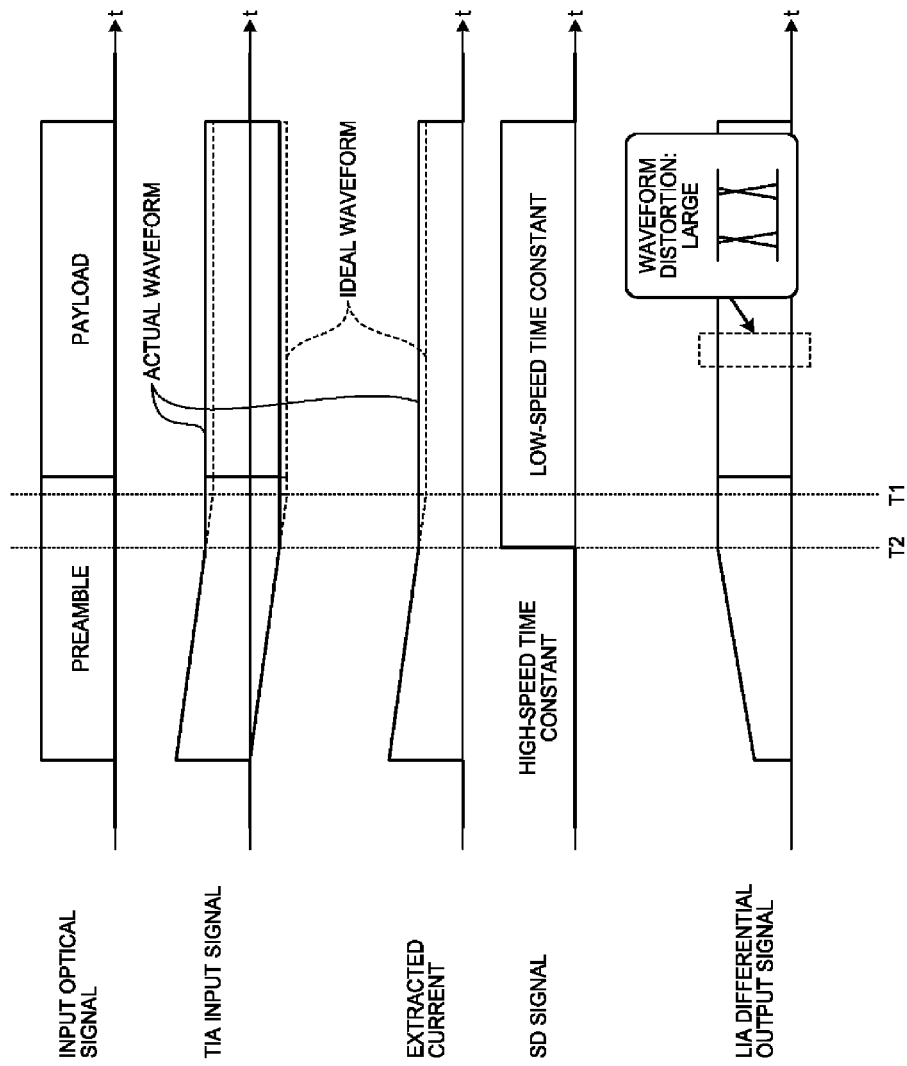
FIG. 3 is a timing chart showing the operation during the packet input of the conventional optical receiver.

FIG. 3 timing chart showing operation during packet input of the conventional optical receiver 100. Operation at timing when the time 12 of the SD signal output is earlier than the convergence time T1 of the AOC converging operation completion is shown. As shown in FIG. 3, when the AOC 230, which performs the offset compensation, operates at low speed and the time T2, when the SD signal is output, is earlier than the convergence time T1, when the AOC converging operation is completed, because of manufacturing variation, the influence of circuit temperature, power supply voltage fluctuation, and the like, in the AOC 230, the time constant is switched to the low-speed time constant before the current source 24 extracts a desired direct current from a current signal output from the APD 1. In this way, because of the manufacturing variation, the influence of circuit temperature, the power supply voltage fluctuation, and the like, the time constant is sometimes switched to the low-speed time constant before the desired direct current is extracted. Such operation can be considered a kind of malfunction because the desired direct current cannot be extracted. In this case, the input signal input to the TIA 21 and the extracted current extracted by the current source 24 respectively operate stably in a state in which the influence of the offset voltage is left as indicated by actual waveforms indicated by solid lines with respect to ideal waveforms indicated by dotted lines in FIG. 3. As a result, waveform distortion of the differential output signals output from the LIA 31 increases and deteriorates a reception characteristic.

The configuration and the operation of the optical receiver according to this embodiment are explained.

Figure 4:
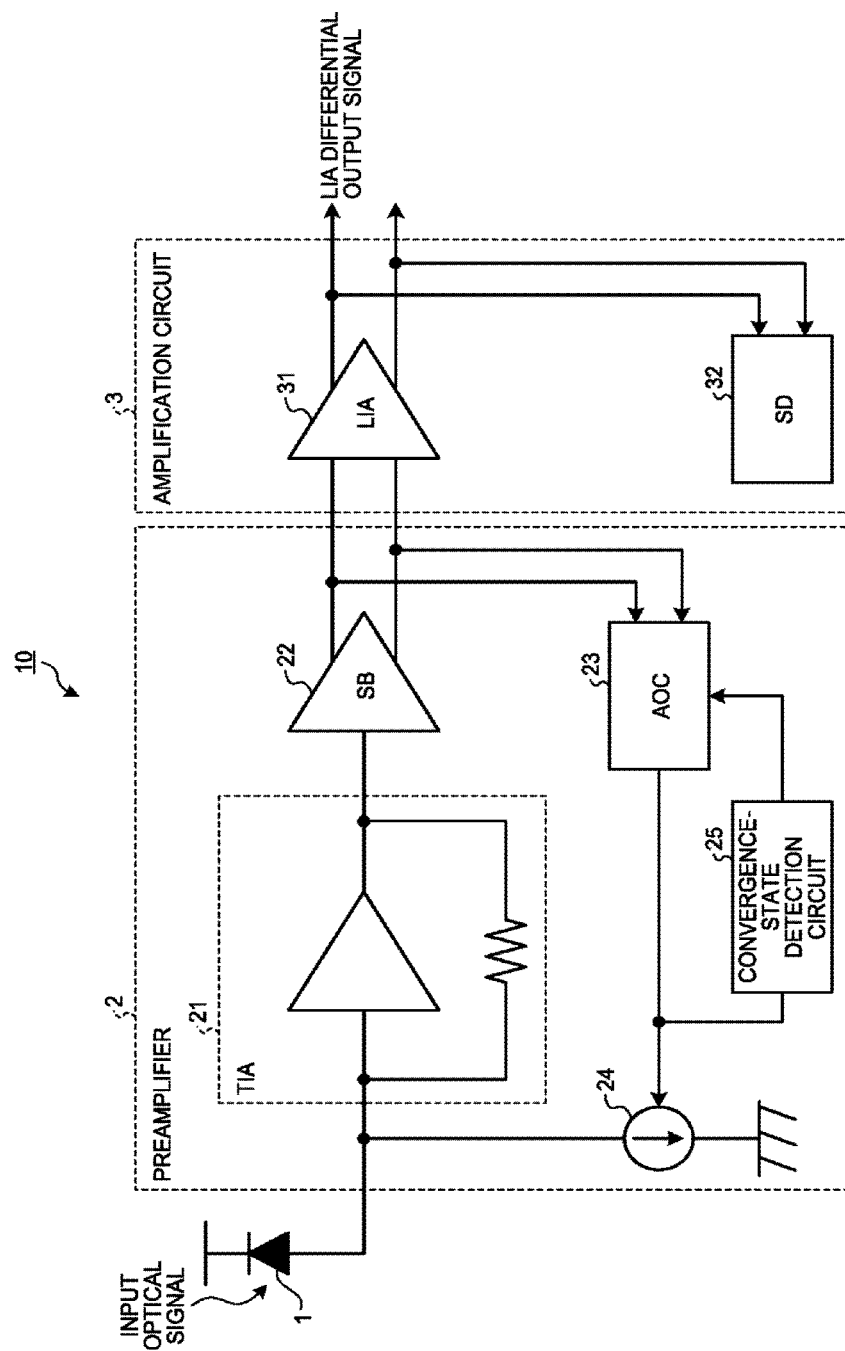
FIG. 4 is a block diagram showing an example of a circuit configuration of an optical receiver in a first embodiment.

FIG. 4 is a block diagram showing an example of a circuit configuration of an optical receiver 10 in this embodiment. It is assumed that the optical receiver 10 is mounted on an OLT and receives an optical signal from an ONU that configures an optical communication system in conjunction with the OLT. The optical receiver 10 includes an APD 1, which is a photocurrent conversion element that performs photocurrent conversion on the received optical signal from the ONU, that is, converts the input optical signal into a current signal, a preamplifier 2 that converts the current signal output from the APD 1 into a voltage signal and outputs the voltage signal, and an amplification circuit 3 that shapes a waveform of the voltage signal output from the preamplifier 2 to output the voltage signal to a not-shown CDR in a post stage or the like. In FIG. 4, components having functions same as the functions of the components of the optical receiver 100 shown in FIG. 1 are denoted by reference numerals and signs same as the reference numerals and signs in FIG. 1.

The preamplifier 2 is an amplifier that converts the current signal converted by the APD 1 into a voltage signal. The preamplifier 2 includes the TIA 21, which is a first amplifier, the SB 22 that converts a single-phase output signal of the TIA 21 into differential output signals, the AOC circuit 23 that integrates the differential output signals of the SB 22 and performs control to extract, with the current source 24, a direct current from the APD 1 to reduce a voltage difference to zero, the current source 24 that extracts the current signal output from the APD 1, and a convergence-state detection circuit 25 that monitors an output signal, which is a response of the AOC circuit 23 to the differential output signals output from the SB 22 and is a control signal to the current source 24, detects a convergence state of the ACC circuit 23, and outputs a time constant switching control signal. In the following explanation and the figures, the AOC circuit 23 is abbreviated as AOC 23. Note that the preamplifier 2 adopts an AOC scheme in which the AOC 23 generates a control signal on the basis of the differential output signals output from the SB 22 and a direct current is extracted from the APD 1 by the current source 24. However, this is an example and the preamplifier 2 is not limited to this. For example, as explained in a fourth embodiment, the time constant switching control of this embodiment can also be applied to an AOC scheme in an offset compensation scheme other than the extraction of the direct current by the current source 24 such as a scheme in which a linear amplifier is provided in a post stage of the SB 22 and offset compensation is performed by the linear amplifier. The AOC 23 is an offset compensation circuit that is capable of switching a time constant and detects an offset voltage between the differential output signals output from the TIA 21 and performs control for compensating for an offset voltage on the basis of the detected offset voltage. The AOC 230 adopts a scheme including the integrator. However, this is an example and the AOC 230 is not limited to this.

The amplification circuit 3 includes an LIA 31, which is a second amplifier that shapes a waveform of the differential output signals output from the preamplifier 2, and an SD 32 that detects presence or absence of the differential output signals output from the LIA 31. Note that the amplification circuit 3 does not have to include the SD 32. Note that the SD 32 is present on the inside of the amplification circuit 3 and generates an SD signal on the basis of the differential output signals output from the LIA 31. However, this is an example and the SD 32 is not limited to this.

In the conventional optical receiver 100 described in Patent Literature 2, the SD signal output from the SD 320 of the amplification circuit 30 is used for the switching of the time constant of the AOC 230. In the optical receiver described in Patent Literature 1 explained above, the time constant of the AOC circuit is switched using the pulse detection result of the pulse detection circuit. On the other hand, the optical receiver 10 in this embodiment is configured to switch the time constant of the AOC 23 while being triggered by an output signal of the convergence-state detection circuit 25 that monitors an output signal of the AOC 23 and detects a convergence state of the AOC 23. Note that the AOC 23 and the convergence-state detection circuit 25 are incorporated in the preamplifier 2 in FIG. 4. However, this is an example. The AOC 23 and the convergence-state detection circuit 25 can be incorporated in the amplification circuit 3 or can be provided on the outside of the preamplifier 2 and the amplification circuit 3.

Figure 5:
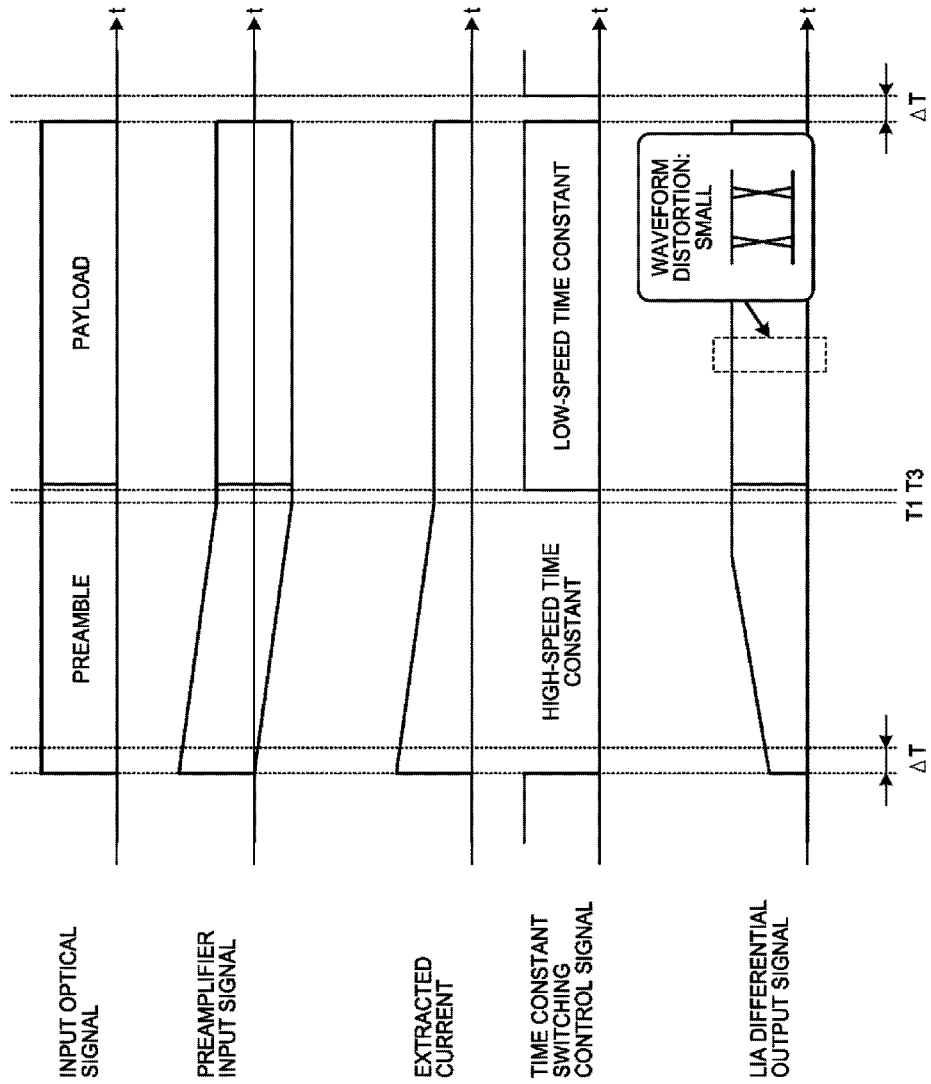
FIG. 5 is a timing chart for explaining time constant switching operation of the optical receiver in the first embodiment.

Specific time constant switching operation in the optical receiver 10 is explained in detail with reference to FIG. 5. FIG. 5 is a timing chart for explaining the time constant switching operation of the optical receiver 10 in this embodiment. FIG. 5 shows, in time series, a relation among an input optical signal to the APD 1, an input signal to the preamplifier 2, an extracted current extracted by the current source 24, a time constant switching control signal output by the convergence-state detection circuit 25, and a positive-phase signal of differential outputs of the LIA 31. In the first stage of FIG. 5, a packet input to the APD 1 as an optical signal, that is, an input optical signal to the APD 1 is shown. In the second stage of FIG. 5, an input signal to the TIA 21 is shown. In the third stage of FIG. 5, an extracted current extracted by the current source 24 is shown. In the fourth stage of FIG. 5, a time constant switching control signal output from the convergence-state detection circuit 25 is shown. In the fifth stage of FIG. 5, a positive-phase signal of differential outputs output from the LIA 31 is shown. In this embodiment, a small, that is, short time constant, which is a first time constant, is represented as a high-speed time constant. A second constant, which is a time constant larger, that is, longer than the high-speed time constant, is represented as a low-speed time constant. The horizontal axis of FIG. 5 indicates time t. Note that $\Delta T$ shown in FIG. 5 is explained in detailed explanation of the convergence-state detection circuit 25 explained below.

When an optical signal having a preamble and a payload cutout to the current source 24 is input to the APD 1, the AOC 23 integrates differential output signals output from the SB 22 and compares integration results to control the current source 24 to reduce a difference to zero. The current source 24 extracts a direct current of the current signal output from the APD 1 according to the control by the AOC 23, whereby an offset voltage, which is a difference between the differential output signals put from the SB 22 is cancelled. Therefore, an offset voltage, which is a difference between the differential output signals input to the LIA 31, is cancelled. It is possible to output a normal waveform having small reception waveform distortion from the LIA 31.

In this embodiment, when fluctuation in the output signal output from the AOC 23 is not detected, the convergence-state detection circuit 25 sets the time constant of the AOC 23 to the low-speed time constant. Therefore, before an optical signal is input, the time constant of the AOC 23 is the low-speed time constant. In this embodiment, the switching of the time constant of the AOC 23 is controlled by a time constant switching control signal. It is assumed that the AOC 23 sets the time constant to the high-speed time constant when the time constant switching control signal is LOW and sets the time constant to the low-speed time constant when the time constant switching control signal is HIGH. Note that the time constant switching control signal only has to be a signal with which it is possible to discriminate whether setting of the low-speed time constant is instructed or setting of the high-speed time constant is instructed. The time constant switching control signal is not limited to the example explained above. For example, the AOC 23 can set the time constant to the high-speed time constant when the time constant switching control signal is HIGH and set the time constant to the low-speed time constant when the time constant switching control signal is LOW.

Figure 6:
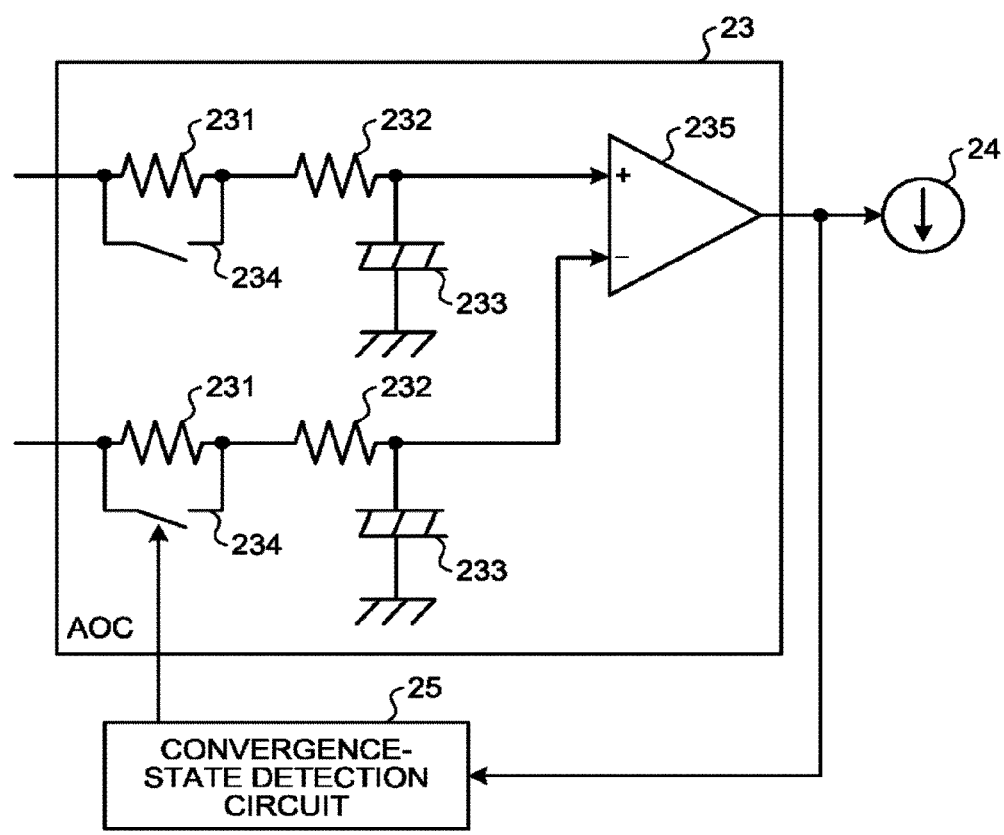
FIG. 6 is a diagram showing a configuration example of an AOC in the first embodiment.

FIG. 6 is a diagram showing a configuration example of the AOC 23 in this embodiment. As shown in FIG. 6, the AOC 23 includes resistors 231 and 232 and capacitors 233 configuring integrators that generate averages of differential output signals, a control circuit unit 235 that extracts a difference between the averages generated by the integrators and generates a control signal for controlling the current source 24, and time-constant-switching switch units 4 that are connected in parallel to the resistors 231 and switch time constants of the integrators on the basis of a signal of the convergence-state detection circuit 25. The differential output signals output from the SB 22 are respectively input to the integrators. The resistances of the resistors 231 and 232 can be the same resistance value or can be different resistance values. An output terminal of the convergence-state detection circuit 25 is connected to the time-constant-switching switch units 234 of the AOC 23 to turn on and off switches according to an output. For example, the time-constant-switching switch units 234 are turned on and change to a short-circuit state when an output, that is, the time constant switching control signal of the convergence-state detection circuit 25 is LOW. The time-constant-switching switch units 234 are turned on and change to an open-circuit state when the output, that is, the time constant switching control signal of the convergence-state detection circuit 25 is HIGH. Specifically, when the output, that is, the time constant switching control signal of the convergence-state detection circuit 25 is LOW, in the AOC 23, because the time-constant-switching switch units 234 on the inside are turned on and changes to the short-circuit state, the resistors 231 are short-circuited. In this state, the time constant is switched to the high-speed time constant. When the output, that is, the time constant switching control signal of the convergence-state detection circuit 25 is HIGH, the time-constant-switching switch units 234 are turned off and change to the open-circuit state. The time constant can be derived as a product of the resistances of the resistor 231 and the resistor 232 and the capacitance of the capacitor 233. Therefore, the time constant increases to be the speed time constant compared with when the time-constant-switching switch units 234 are on, that is, in the short-circuit state. According to this operation, the AOC 23 enables time constant switching.

Note that the AOC 23 shown in FIG. 6 is an example and is not limited to this. The time constant switching scheme shown in FIG. 6 is an example and is not limited to this.

Referring back to FIG. 5, as shown in FIG. 5, when an optical signal is input to the APD 1, the time constant of the AOC 23 is switched to the high-speed time constant. Specifically, immediately after a preamble, which is a head portion, of the input optical signal to the APD 1 is input, when the differential output signals of the SE 22 of the preamplifier 2 change and the AOC 23 starts operation, the convergence-state detection circuit 25 detects an output signal of the AOC 23 and switches a value of a time constant switching control signal to be output from a value indicating the low-speed time constant to a value indicating the high-speed time constant. Specifically, in the example shown in FIG. 5, the convergence-state detection circuit 25 switches the time constant switching control signal from HIGH to LOW. The AOC 23 switches the time constant to the high-speed time constant on the basis of the time constant switching control signal. The output signal of the AOC 23 detected when the optical signal is input to the APD 1 is an output signal in a state in which the AOC 23 is in a transient response state and a voltage value of the output signal output from the AOC 23 changes.

When the AOC converging operation is completed at timing of the convergence time T1 by the AOC 23 having the high-speed time constant and the current source 24, that is, the control by the AOC 23 converges, the convergence-state detection circuit 25 detects that the transient response state of the AOC 23 ends and the output signal output from the AOC 23 converges to a constant voltage value and switches the output from LOW to HIGH at time same as the convergence time T1 or time T3 later than the convergence time T1. According to this operation, the time constant switching control signal of HIGH is input to the AOC 23 from the convergence-state detection circuit 25. The AOC 23 switches the time constant from the high-speed time constant to the low-speed time constant. The convergence time T1 is time when the control by the AOC 23 converges "The control by the AOC 23 converges" means that a control amount instructed to the current source 24 from the AOC 23, that is, an amount of an extracted current decreases to be equal to or smaller than a threshold. Specifically, "the control by the AOC 23 converges" means that the output signal output from the AOC 23 decreases to be equal to or smaller than a threshold.

In the conventional optical receiver 100, the time constant is switched according to the external signal from the SD 320 of the amplification circuit 30 independent from the AOC 230. On the other hand, in this embodiment, the optical receiver 10 uses, as the time constant switching control signal, the output signal of the convergence-state detection circuit 25 synchronized with the AOC 23. Time from the start to the convergence of the control by the AOC 23 is not fixed because the time depends on manufacturing variation, the influence of circuit temperature, power supply voltage fluctuation, and the like. In the conventional optical receiver 100, the time constant is switched by the external signal from the SD 320 without taking into account an AOC convergence state. Therefore, depending on the manufacturing variation, the influence of circuit temperature, and the power supply voltage fluctuation, the switching of the time constant is sometimes performed before the control by the AOC converges. When the switching of the time constant is performed before the control by the AOC converges, a desired direct current cannot be extracted. Consequently, an offset voltage between differential signals remains. Waveform distortion occurs in a reception waveform output from the LIA. On the other hand, in this embodiment, the optical receiver 10 uses, as the time constant switching control signal, the output signal of the convergence-state detection circuit 25 synchronized with the AOC 23. Therefore, it is possible to switch the time constant after the AOC convergence completion without depending on the manufacturing variation, the influence of circuit temperature, the power supply voltage fluctuation, and the like. It is possible to stably realize a normal reception waveform having small waveform distortion.

The configuration and the operation of the convergence-state detection circuit 25 are explained in detail with reference to FIGS. 7 and 8. The convergence state detection circuit 25 generates and outputs a time constant switching control signal. Specifically, the convergence-state detection circuit 25 generates a signal indicating a voltage difference between an AOC output signal and a signal obtained by delaying the AOC output signal by a specified time. When the generated signal is larger than a first threshold or smaller than a second threshold smaller than the first threshold, the convergence-state detection circuit 25 sets the time constant switching control signal to LOW, which indicates that the time constant is set to the high-speed time constant. When the signal indicating the voltage difference between the AOC output signal and the signal obtained by delaying the AOC output signal by the specified time is equal to or smaller than the first threshold and equal to or larger than the second threshold, the convergence-state detection circuit 25 sets the time constant switching control signal to HIGH, which indicates that the time constant is set to the high-speed time constant.

Figure 7:
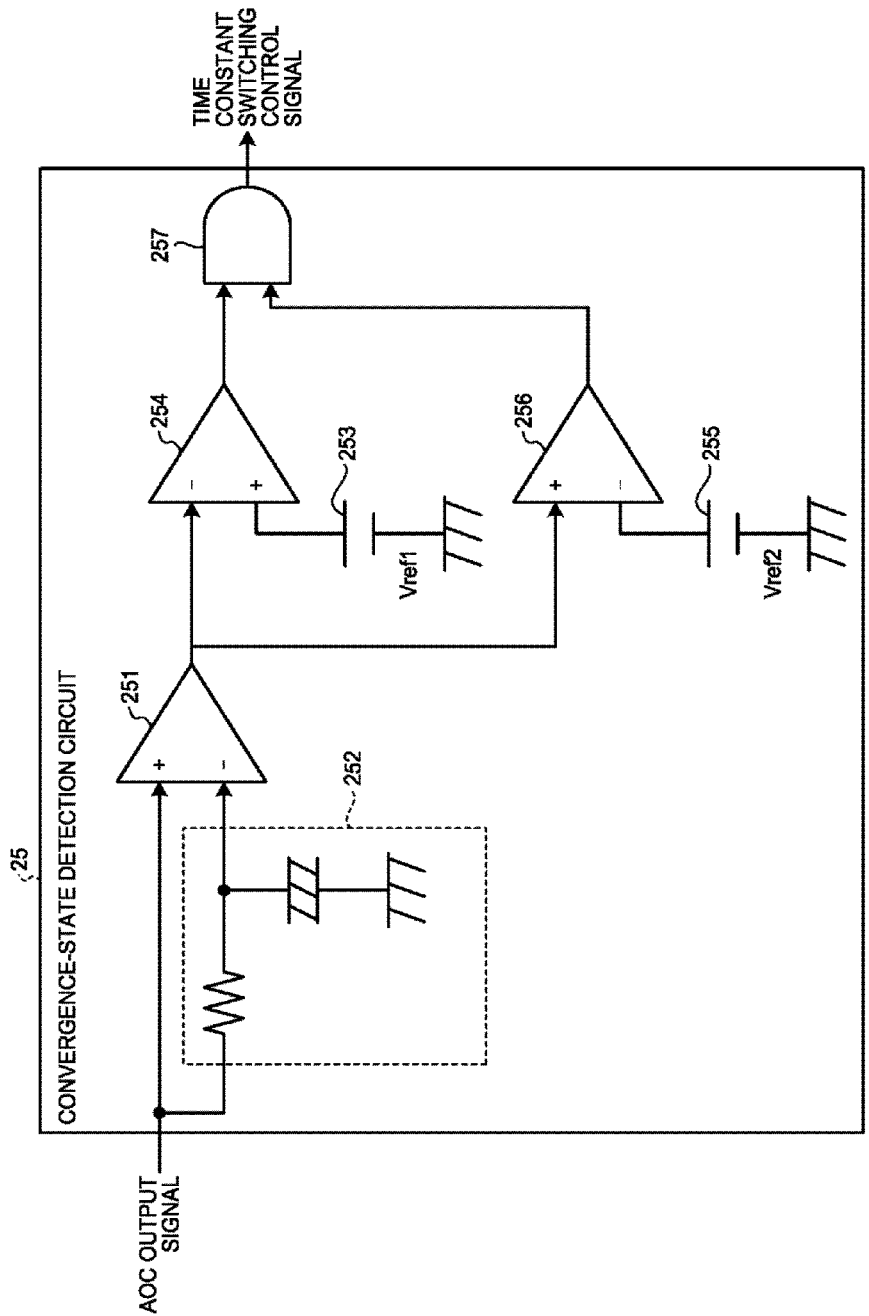
FIG. 7 is a block diagram showing an example of a circuit configuration of a convergence-state detection circuit in the first embodiment.

FIG. 7 is a block diagram showing an example of a circuit configuration of the convergence-state detection circuit 25 in this embodiment. After detecting the convergence completion of the AOC 23 on the basis of the AOC output signal, the convergence-state detection circuit 25 outputs, to the AOC 23, a time constant switching control signal for switching the time constant of the AOC 23 from the high-speed time constant to the low-speed time constant. The convergence-state detection circuit 25 includes a high-gain amplifier 251 that amplifies a difference between an output signal output from the AOC 23, that is an AOC output signal and a delay signal output from a delay circuit 252 explained below, the delay circuit 252 that can be configured by a resistor and a capacitor and delays the AOC output signal input to the convergence-state detection circuit 25 by ΔT, which is a specified time, to generate a delay signal, a reference voltage source 253, which is a first reference voltage source that generates a constant voltage of a reference voltage Vref1, that is, a first threshold voltage, a hysteresis comparator 254, which is a first hysteresis comparator, a reference voltage source 255, which is a second reference voltage source that generates a constant voltage of a reference voltage Vref2, that is, a second threshold voltage, a hysteresis comparator 256, which is a second hysteresis comparator, and an AND circuit 257. Note that circuit configurations of the convergence-state detection circuit 25 and the delay circuit 252 are not limited to the configurations shown in FIG. 7.

Figure 8:
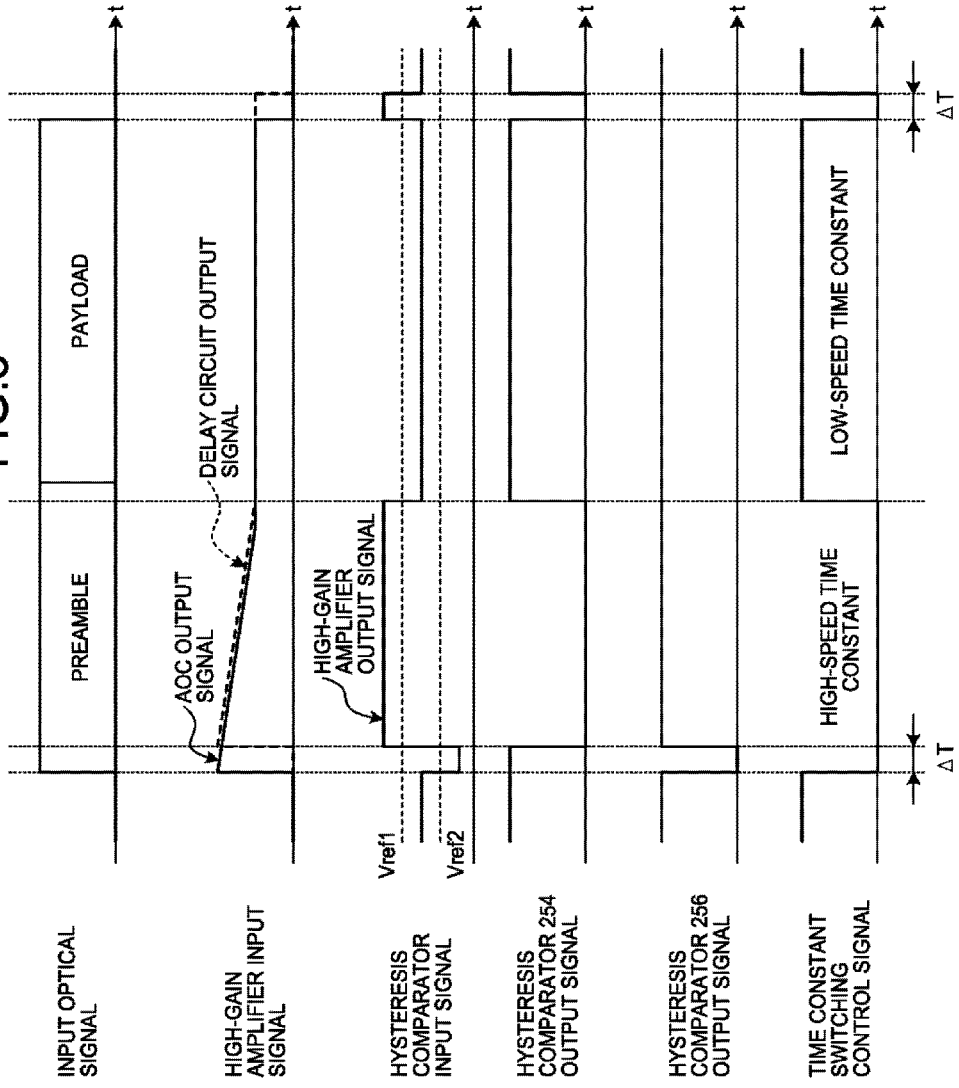
FIG. 8 is a timing chart for explaining the operations of components of the convergence-state detection circuit in the first embodiment.

FIG. 8 shows, in time series, a relation among an input optical signal to the APD 1, an AOC output signal, which is an input signal to the high-gain amplifier 251, and a delay circuit output signal, that is, a delay signal, which is an output signal from the delay circuit 252, an output signal of the high-gain amplifier 251, which is an input signal to the hysteresis comparators 254 and 256, an output signal of the hysteresis compactor 254, an output signal of the hysteresis comparator 256, and a time constant switching control signal output by the AND circuit 257.

The convergence-state detection circuit 25 divides the input AOC output signal into two routes, directly inputs one AOC output signal to a positive-phase input terminal of the high-gain amplifier 251, and inputs a signal obtained by delaying the other AOC output signal by ΔT through the delay circuit 252 to a negative-phase input terminal of the high-gain amplifier 251 as a delay signal.

The high-gain amplifier 251 outputs a signal obtained by amplifying a difference between a positive-phase input terminal voltage and a negative-phase input terminal voltage, that is, a differential voltage. That is, the high-gain amplifier 251 generates and outputs a signal indicating a voltage difference between the AOC output signal input to the convergence-state detection circuit 25 and the delay signal obtained by delaying the AOC output signal by ΔT. When there is a change in the AOC output signal, a difference occurs between a voltage value of the AOC output signal input to the convergence-state detection circuit 25 and a voltage value of the delay circuit output signal obtained by delaying the AOC output signal by ΔT. Therefore, it is possible to determine on the basis of a signal output from the high-gain amplifier 251 whether there is a change in the AOC output signal. The high-gain amplifier 251 outputs the amplified signal to a negative-phase input terminal of the hysteresis comparator 254 and a positive-phase input terminal of the hysteresis comparator 256. Note that a voltage output by the high-gain amplifier 251 when a differential voltage of a positive-phase input terminal voltage and a negative-phase input terminal voltage is zero is calculated as a voltage center value Vc in advance. The high-gain amplifier 251 outputs a value lower than the voltage center value Vc when the positive-phase input terminal voltage is higher than the negative-phase input terminal voltage and outputs a value higher than the voltage center value Vc when the positive-phase input terminal voltage is lower than the negative-phase input terminal voltage. The voltage center value Vc can be calculated by measurement. A design value or the like can be used as the voltage center value Vc.

The reference voltages Vref1 and Vref2 are voltages serving as a first threshold voltage and a second threshold voltage used in determining whether there is a change in the AOC output signal. The reference voltage Vref1 is higher than the voltage center value Vc. The reference voltage Vref2 is lower than the voltage center value Vc. When a voltage difference between the AOC output signal and the delay circuit output signal obtained by delaying the AOC output signal by ΔT is equal to or larger than Vref2 and equal to or smaller than Vref1, the convergence-state detection circuit 25 determines that there is no change in the AOC output signal. When the voltage difference is smaller than Vref2 or larger than Vref1, the convergence-state detection circuit 25 determines that there is a change in the AOC output signal.

The hysteresis comparator 254 compares the reference voltage Vref1 generated by the reference voltage source 253 and input to the positive-phase input terminal and the voltage of the output signal of the high-gain amplifier 251 input to the negative-phase input terminal. The reference voltage Vref1 is set to a value higher than the voltage center value Vc of the high-gain amplifier 251 and lower than a maximum voltage of a voltage range that can be output by the high-gain amplifier 251. When the output signal voltage of the high-gain amplifier 251 is higher when compared with the reference voltage Vref1, the hysteresis comparator 254 outputs LOW. In other cases, the hysteresis comparator 254 outputs HIGH. In other words, the hysteresis comparator 254 determines whether the output signal voltage of the high-gain amplifier 251 is higher when compared with the reference voltage Vref1 and outputs a determination result.

The hysteresis comparator 256 compares the output signal voltage of the high-gain amplifier 251 input to the positive-phase input terminal and the reference voltage Vref2 generated by the referenced voltage source 255 and input to the negative-phase input terminal. The reference voltage Vref2 is set to a value lower than the voltage center value Vc of the high-gain amplifier 251 and higher than a minimum voltage of a voltage range that can be output by the high-gain amplifier 251. When the output signal voltage of the high-gain amplifier 251 is higher compared with the reference voltage Vref2, the hysteresis comparator 256 outputs LOW. In other cases, the hysteresis comparator 256 outputs HIGH. In other words, the hysteresis comparator 256 determines whether the output signal voltage of the high-gain amplifier 251 is lower compared with the reference voltage Vref2 and outputs a determination result.

That is, the hysteresis comparator 256 can detect a change in a negative direction, that is, a change in which the voltage of the delay circuit output signal obtained by delaying the AOC output signal by $\Delta T$ is lower than the voltage of the AOC output signal. The hysteresis comparator 254 can detect a change in a positive direction, that is, a change in which the voltage of the delay circuit output signal obtained by delaying the AOC output signal by $\Delta T$ is higher than the voltage of the AOC output signal. Both of the hysteresis comparators 254 and 256 output LOW when detecting a change in the AOC output voltage signal and outputs HIGH when detecting that a change in the AOC output signal is not detected, that is, there is no change in the AOC output signal.

When signals are input from the hysteresis comparators 254 and 256, the AND circuit 257 calculates an AND of the two signals. That is, by performing AND operation, the AND circuit 257 is capable of detecting a section in which the AOC output signal is changing, that is, a section obtained by combining an AOC operation section and $\Delta T$. As shown in FIG. 8, concerning the time constant switching control signal output from the convergence-state detection circuit 25, when both the outputs from the two hysteresis comparators 254 and 256 are HIGH, the AND circuit 257 outputs a signal of HIGH indicating that the time constant of the AOC 23 is switched to the low-speed time constant. When one of the outputs from the hysteresis comparators 254 and 256 is LOW, because of the AOC operation section, the AND circuit 257 outputs a signal of LOW indicating that the time constant of the AOC 23 is switched to the high-speed time constant. That is, when the determination result output from the hysteresis comparator 254 indicates that the voltage of the output signal of the high-gain amplifier 251 is higher than Vref1 or when the determination result output from the hysteresis comparator 256 indicates that the output signal of the high-gain amplifier 251 is lower than Vref2, the AND circuit 257, which is an arithmetic circuit, outputs a first value indicating instruction of the high-speed time constant, that is, in this example, the time constant switching control signal of LOW. On the other hand, when the determination result output from the hysteresis comparator 254 indicates that the voltage of the output signal of the high-gain amplifier 251 is equal to or lower than Vref1 and the determination result output from the second hysteresis comparator 256 indicates that the voltage of the output signal of the high-gain amplifier 251 is equal to or higher than Vref2, the AND circuit 257 outputs a second value indicating instruction of the low-speed time constant, in this example, the time constant switching control signal of HIGH.

Note that, in the example explained above, the time constant of the AOC 23 is switched to the high-speed time constant when the value of the time constant switching control signal is LOW and the time constant of the AOC 23 is switched to the low-speed time constant when the value of the time constant switching control signal is HIGH. However, the time constant of the AOC 23 can be switched to the high-speed time constant when the value of the time constant switching control signal is HIGH. The time constant of the AOC 23 can be switched to the low-speed time constant when the value of the time constant switching control signal is LOW. In this case, the convergence-state detection circuit 25 outputs HIGH when detecting a change in the AOC output signal and outputs LOW when detecting that there is no change in the AOC output signal. Specifically, the AND circuit 257 can be changed to a NAND circuit. It is also possible to change circuit components other than the AND circuit 257 in the convergence-state detection circuit 25, output HIGH when a change in the AOC output signal is detected, and output LOW when it is detected that there is no change in the AOC output signal. That is, the convergence-state detection circuit 25 is not limited to the configuration example shown in FIG. 7. The convergence-state detection circuit 25 only has to be capable of outputting a signal indicating presence or absence of a change in the AOC output signal by comparing a difference between the AOC output signal and a signal obtained by delaying the AOC output signal.

As explained above, according to this embodiment, in the optical receiver 10, the AOC 23 uses, as the time constant switching control signal, the output signal of the convergence-state detection circuit 25 synchronized with the AOC 23. Consequently, it is possible to switch the time constant after the AOC convergence completion without depending on manufacturing variation, the influence of circuit temperature, power supply voltage fluctuation, and the like. It is possible to stably realize a normal reception waveform having small waveform distortion.

Note that, in this embodiment, the operation for switching the time constant of the AOC 23 is explained. However, this is an example and the switching of the time constant is not limited to this. When the optical receiver includes an AGC having a time constant switching function instead of the AOC 23, as in this embodiment, it is possible to switch the time constant of the AGC after the AGC convergence completion.

Second Embodiment

In this embodiment, an optical receiver capable of inputting a reset signal to an AOC and a current source is explained.

Figure 9:
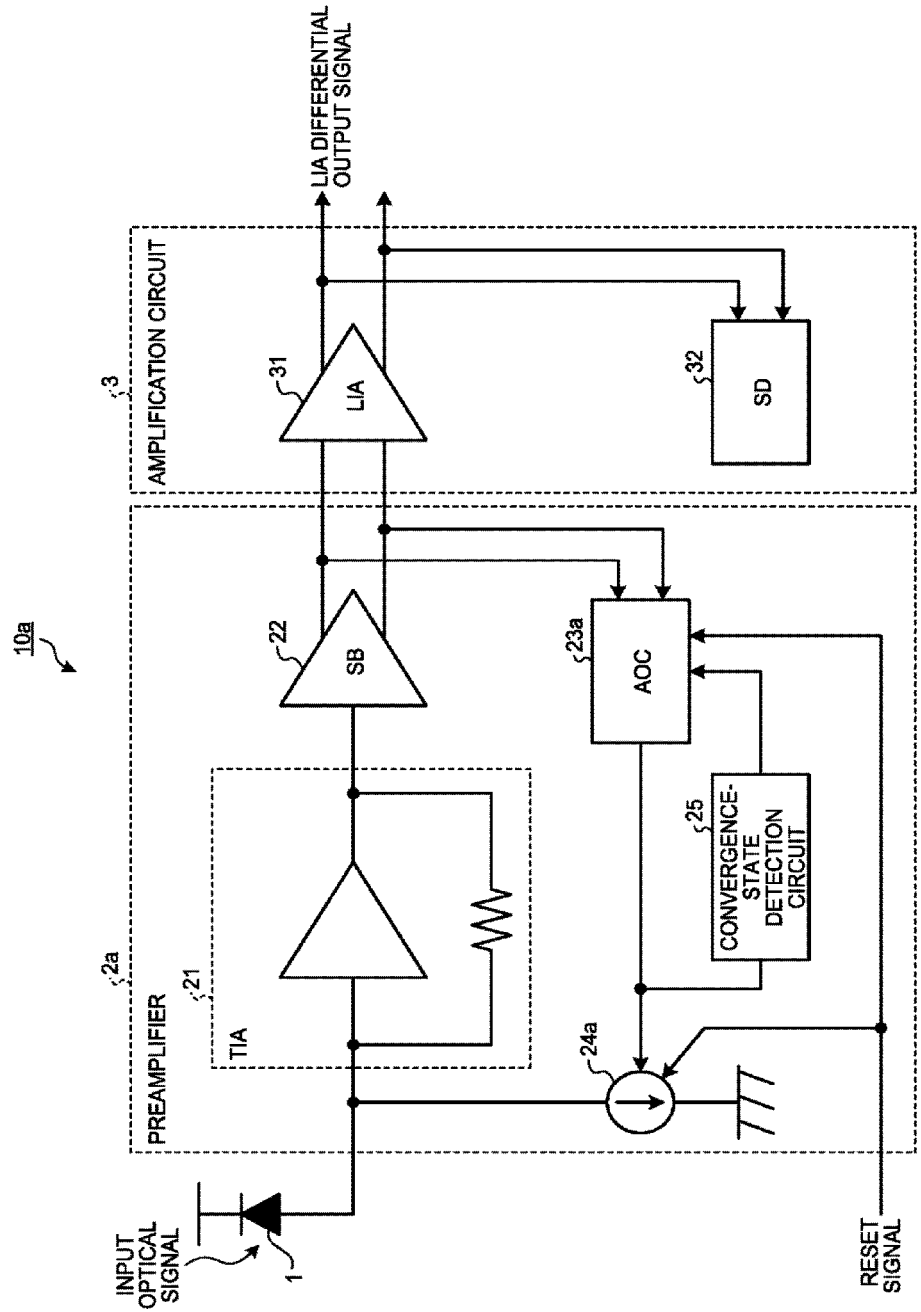
FIG. 9 is a block diagram showing an example of a circuit configuration of an optical receiver in a second embodiment.

FIG. 9 is a block diagram showing an example of a circuit configuration of an optical receiver 10a in this embodiment. It is assumed that the optical receiver 10a is mounted on an OLT and receives an optical signal from an ONU that configures an optical communication system in conjunction with the OLT. The optical receiver 10a includes the APD 1, a preamplifier 2a that converts a current signal converted by the APD 1 into a voltage signal and outputs the voltage signal, and the amplification circuit 3. The preamplifier 2a is different from the preamplifier 2 in the first embodiment in that the preamplifier 2a includes, instead of the AOC 23 and the current source 24, an AOC 23a and a current source 24a that require reset signal supply from the outside. In the OLT, between packets, that is, burst signals, a reset signal is sometimes input to initialize a capacitance element and the like used for control in the optical receiver. In this embodiment, a configuration and operation at the time when a reset signal is input from the outside and a control amount, that is, an extracted current of the AOC 23a is initialized by the reset signal are explained. Note that the AOC 23a and the convergence-state detection circuit 25 are incorporated in the preamplifier 2a in FIG. 9. However, this is an example. The AOC 23a and the convergence-state detection circuit 25 can be incorporated in the amplification circuit 3 or can be provided on the outside of the preamplifier 2a and the amplification circuit 3. Differences from the first embodiment are explained below. The configuration and the operation in this embodiment other than the points explained below are the same as the configuration and the operation in the first embodiment.

Figure 10:
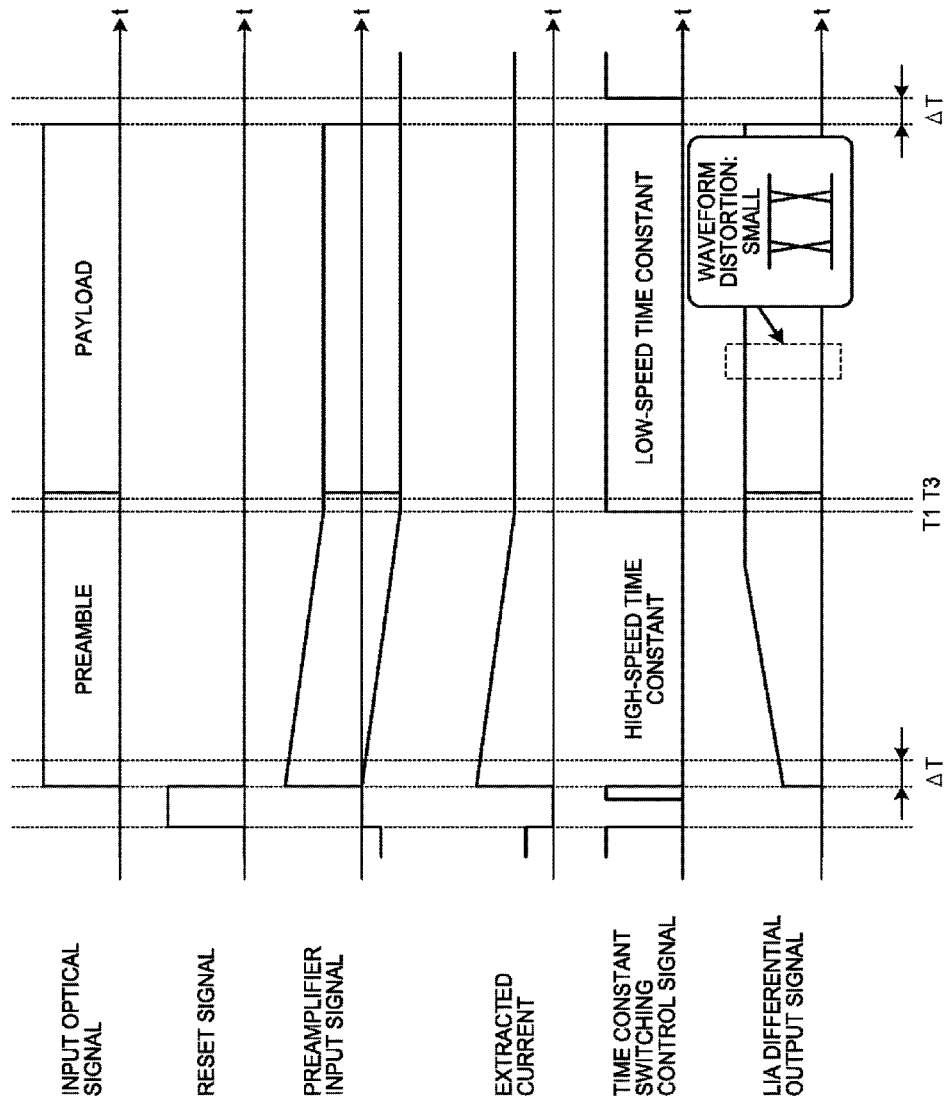
FIG. 10 is a timing chart for explaining time constant switching operation of the optical receiver in the second embodiment.

Specific time constant switching operation in the optical receiver 10a is explained in detail with reference to FIG. 10. FIG. 10 is a timing chart for explaining the time constant switching operation of the optical receiver 10a in this embodiment. FIG. 10 shows, in time series, a relation among an input optical signal to the APD 1, a reset signal, an input signal to the preamplifier 2a, an extracted current extracted by the current source 24a, a time constant switching control signal output by the convergence-state detection circuit 25, and differential output signals of the LIA 31.

As opposed to the operation of the optical receiver 10 shown in FIG. 5 explained in the first embodiment, when a rest signal is input to the optical receiver 10a in this embodiment from the outside, the output signal of the AOC 23a and the extracted current of the current source 24a are initialized. Consequently, in the optical receiver 10a, when a packet, which is an optical signal, is input, the input of the packet is not affected by information concerning a packet input immediately before the packet. Therefore, it is possible to perform a high-speed response to the burst signal. In the optical receiver 10a, as in the first embodiment, by controlling time constant switching in synchronization with the AOC 23a using the convergence-state detection circuit 25, it is possible to stably realize a normal reception waveform having small waveform distortion.

When the AOC 23a is initialized by input of a reset signal, the AOC 23a responds to the reset signal. As a result, an output signal from the AOC 23a changes. Because the output signal of the AOC 23a changes, the convergence-state detection circuit 25 operates. That is, as shown in FIG. 10, the AOC 23a is instructed to be reset by the reset signal before a packet, that is, an optical signal is input to the APD 1. In an example shown in FIG. 10, the reset signal changes from LOW to HIGH, whereby the reset is instructed. When being instructed to be reset by the reset signal, the AOC 23a sets a control amount, that is, an extracted current instructed by the AOC output signal to an initial value. Zero can be used as the initial value. However, a value of the initial value is not limited to this. When the AOC output signal is set to the initial value once, the convergence-state detection circuit 25 detects that there is a change in the AOC output signal and instructs, with a time constant switching control signal, the AOC 23a to switch the time constant of the AOC 23a from the low-speed time constant to the high-speed time constant.

Figure 11:
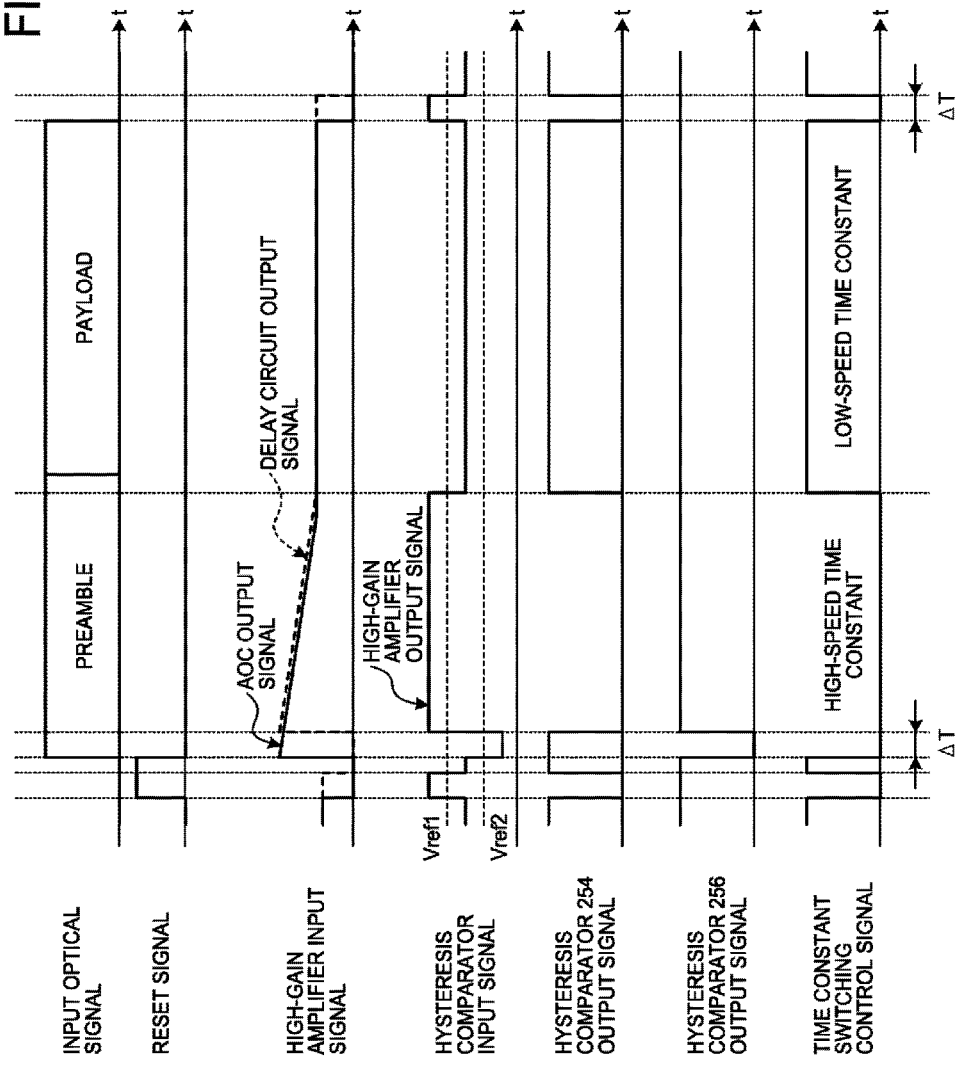
FIG. 11 is a timing chart for explaining the operations of components of a convergence-state detection circuit in the second embodiment.

FIG. 11 is a timing chart for explaining the operations of the components of the convergence-state detection circuit 25 in this embodiment. FIG. 11 shows, in time series, a relation among an input optical signal to the APD 1, a rest signal, an output signal of the AOC 23a and an output signal of the delay circuit 252, which are input signals to the high-gain amplifier 251, an output signal of the high-gain amplifier 251, which is an input signal to the hysteresis comparators 254 and 256, an output signal of the hysteresis comparator 254, an output signal of the hysteresis comparator 256, and a time constant switching control signal output by the AND circuit 257. In FIG. 10 and FIG. 11, it is assumed that the reset signal is input immediately before a preamble is received. However, this is an example. For example, the reset signal can be input into the preamble. The input of the reset signal is not limited.

As in the first embodiment, when detecting a change in the AOC output signal, the convergence-state detection circuit 25 switches the time constant switching control signal from the low-speed time constant to the high-speed time constant. However, a signal from the APD 1 does not change from the input of the reset signal to the AOC 23a until the input of the packet to the APD 1. Therefore, when ΔT elapses from the input of the reset signal to the AOC 23a, a difference between the AOC output signal and a signal obtained by delaying the AOC output signal by ΔT is between Vref2 and Vref1. Therefore, the time constant switching control signal output from the convergence-state detection circuit 25 is switched from a value indicating the high-speed time constant to a value indicating the low-speed time constant. That is, the convergence-state detection circuit 25 once switches the time constant switching control signal to be output from the low-speed time constant to the high-speed time constant according to a change in an output signal voltage of the AOC 23a due to the reset signal input. Thereafter, when an operation target packet is not input in the AOC 23a, the convergence-state detection circuit 25 discriminates that there is no change in the output signal voltage of the AOC 23a and switches the time constant switching control signal to be output from the high-speed time constant to the low-speed time constant. In this way, the AOC 23a is set to the high-speed time constant by the reset signal in a period in which there is no packet input. However, the time constant of the AOC 23a is switched to the low-speed time constant before packet input is performed next. Therefore, operation after a packet input start is the same as the operation in the first embodiment. A time period in which the AOC 23a is set to the high-speed time constant in the period in which there is no packet input is short. Deterioration of identical code succession tolerance is little.

In this way, in the optical receiver 10a, when there is no input of a packet with which the AOC 23a operates, the convergence-state detection circuit 25 once switches the time constant switching control signal from the low-speed time constant to the high-speed time constant. Thereafter, the convergence-state detection circuit 25 switches the time constant switching control signal to the low-speed time constant and prepare for packet input. Therefore, it is possible to apply the optical receiver 10a, which requires a rest signal, to operation same as the operation in the first embodiment. Note that, even when the reset signal is input during the reception of the preamble, the convergence-state detection circuit 25 maintains LOW indicating that output of the time constant switching control signal is set to the high-speed time constant until convergence completion of the AOC 23a. When detecting the convergence completion of the AOC 23a, the convergence-state detection circuit 25 switches the time constant switching control signal from LOW indicating that the output of the time constant switching control signal is set to the high-speed time constant to HIGH indicating that the output of the time constant switching control signal is set to the low-speed time constant. Therefore, there is no problem.

As explained above, according to this embodiment, in the optical receiver 10a, even in a configuration in which the reset signal is input from the outside and the initialization of the AOC 23a is performed, the output signal of the convergence-state detection circuit 25 synchronized with the AOC 23a is used as the time constant switching control signal. Consequently, as in the first embodiment, it is possible to switch the time constant from the low-speed time constant to the high-speed time constant when a packet is input and the AOC 23a starts AOC converging operation and switch the time constant from the high-speed time constant to the low-speed time constant after AOC convergence completion. It is possible to stably realize a normal reception waveform having small waveform distortion.

Note that, in this embodiment, the operation for switching the time constant of the AOC 23a is explained. However, this is an example and the switching of the time constant is not limited to this. Even in a configuration in which the optical receiver includes an AGC having a time constant switching function instead of the AOC 23a and performs initialization of the AGC when a reset signal is input from the outside, as in this embodiment, the optical receiver can switch a time constant of the AGC after AGC convergence completion.

Third Embodiment

In this embodiment, an SD signal is input to a convergence-state detection circuit in addition to an AOC output signal. The convergence-state detection circuit switches a time constant in synchronization with the SD signal as well.

Figure 12:
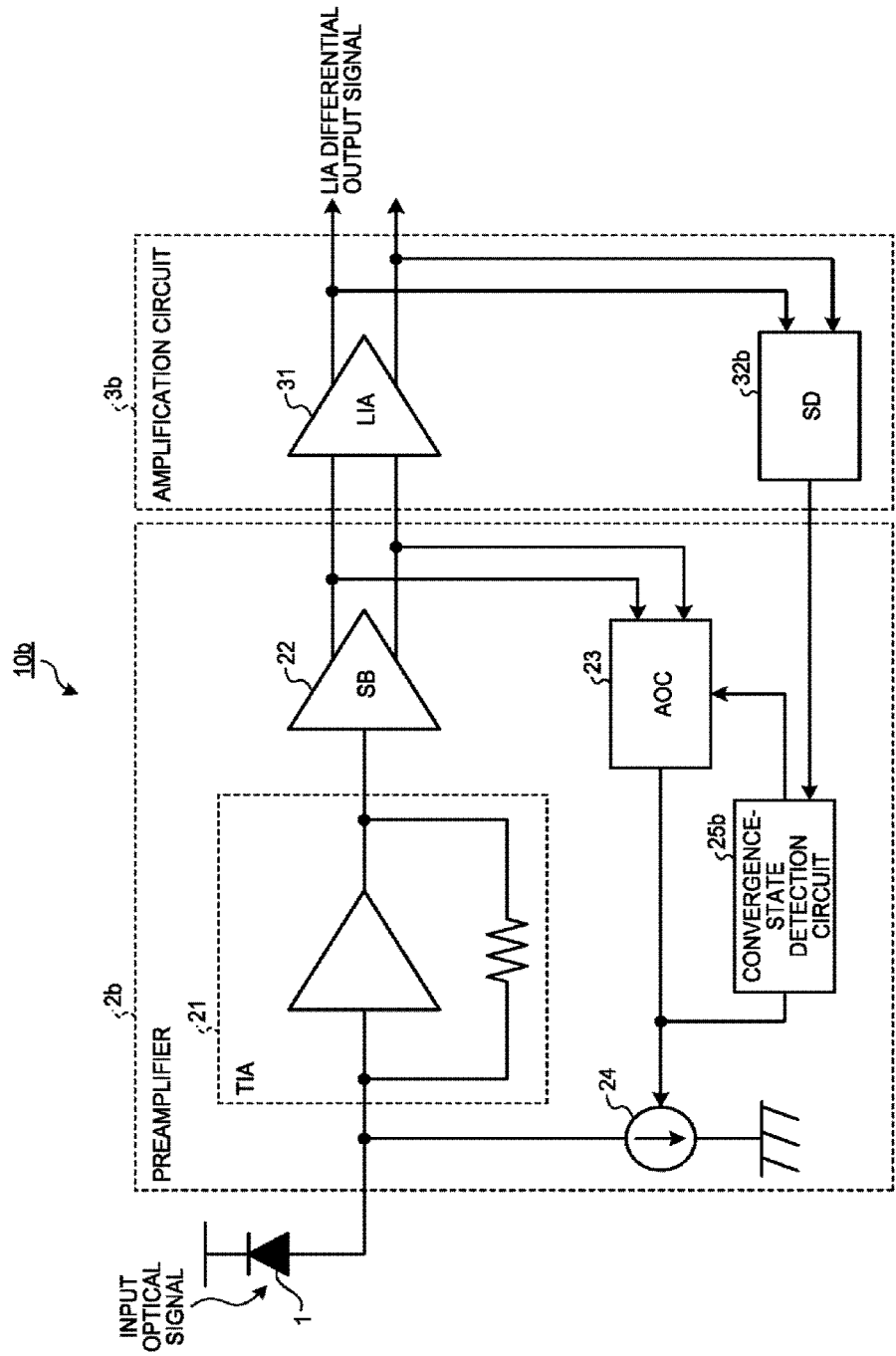
FIG. 12 is a block diagram showing an example of a circuit configuration of an optical receiver in a third embodiment.

FIG. 12 is a block diagram showing an example of a circuit configuration of an optical receiver 10b in this embodiment. It is assumed that the optical receiver 10b is mounted on an OLT and receives an optical signal from an ONU that configures an optical communication signal in conjunction with the OLT. The optical receiver 10b includes the APD 1, a preamplifier 2b that converts a current signal converted by the APD 1 into a voltage signal and outputs the voltage signal, and an amplification circuit 3b that shapes a waveform of differential output signals output from the preamplifier 2b. The preamplifier 2b is different from the preamplifier 2 in the first embodiment in that the preamplifier 2b includes, instead of the convergence-state detection circuit 25, a convergence-state detection circuit 25b, which is a detection circuit to which the SD signal is input from an SD 32b together with an output signal of the AOC 23.

The amplification circuit 3b is different from the amplification circuit 3 in the first embodiment in that the amplification circuit 3b includes, instead of the SD 32, the SD 32b that detects presence or absence of differential output signals from the LIA 31, which is a second amplifier of the amplification circuit 3b, and outputs an SD signal to the convergence-state detection circuit 25b. The SD 32b outputs an SD signal that changes to HIGH when the differential output signals are present and changes to LOW when the differential output signals are absent. Note that, in FIG. 12, a synchronization target of the convergence-state detection circuit 25b is the SD signal. However, this is an example and the synchronization target is not limited to this. In FIG. 12, the AOC 23 and the convergence-state detection circuit 25b are incorporated in the preamplifier 2b. However, this is an example. The AOC 23 and the convergence-state detection circuit 25b can be incorporated in the amplification circuit 3b or can be provided on the outside of the preamplifier 2b and the amplification circuit 3b. In FIG. 12, the SD 32b is incorporated in the amplification circuit 3b. However, this is an example. The SD 32b can be provided on the outside of the amplification circuit 3b. In addition, the SD signal is generated on the basis of the differential output signals output from the LIA 31. However, this is an example and the generation of the SD signal is not limited to this. Differences from the first embodiment are explained below. The configuration and the operation in this embodiment other than the points explained below are the same as the configuration and the operation in the first embodiment.

Figure 13:
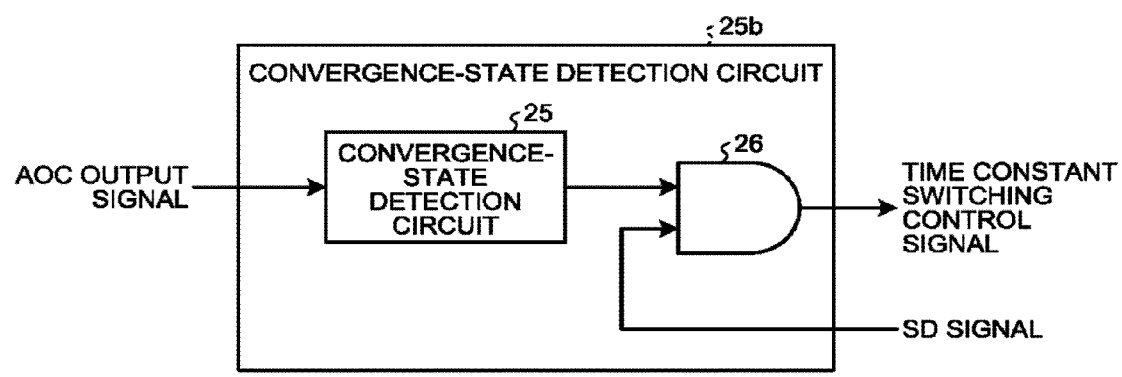
FIG. 13 is a block diagram showing an example of a circuit configuration of a convergence-state detection circuit in the third embodiment.

The configuration and the operation of the convergence-state detection circuit 25b are explained in detail with reference to FIGS. 13 and 14. FIG. 13 is a block diagram showing an example of a circuit configuration of the convergence-state detection circuit 25b in this embodiment. The convergence-state detection circuit 25b includes the convergence-state detection circuit 25 same as the convergence-state detection circuit 25 in the first embodiment and an AND circuit 26 that receives, as inputs, the output signal of the convergence-state detection circuit 25 and the SD signal output from the SD 32b, calculates an AND, and generates a time constant switching control signal of the AOC 23. Note that the configuration of the convergence-state detection circuit 25b shown in FIG. 13 is an example and is not limited to this.

Figure 14:
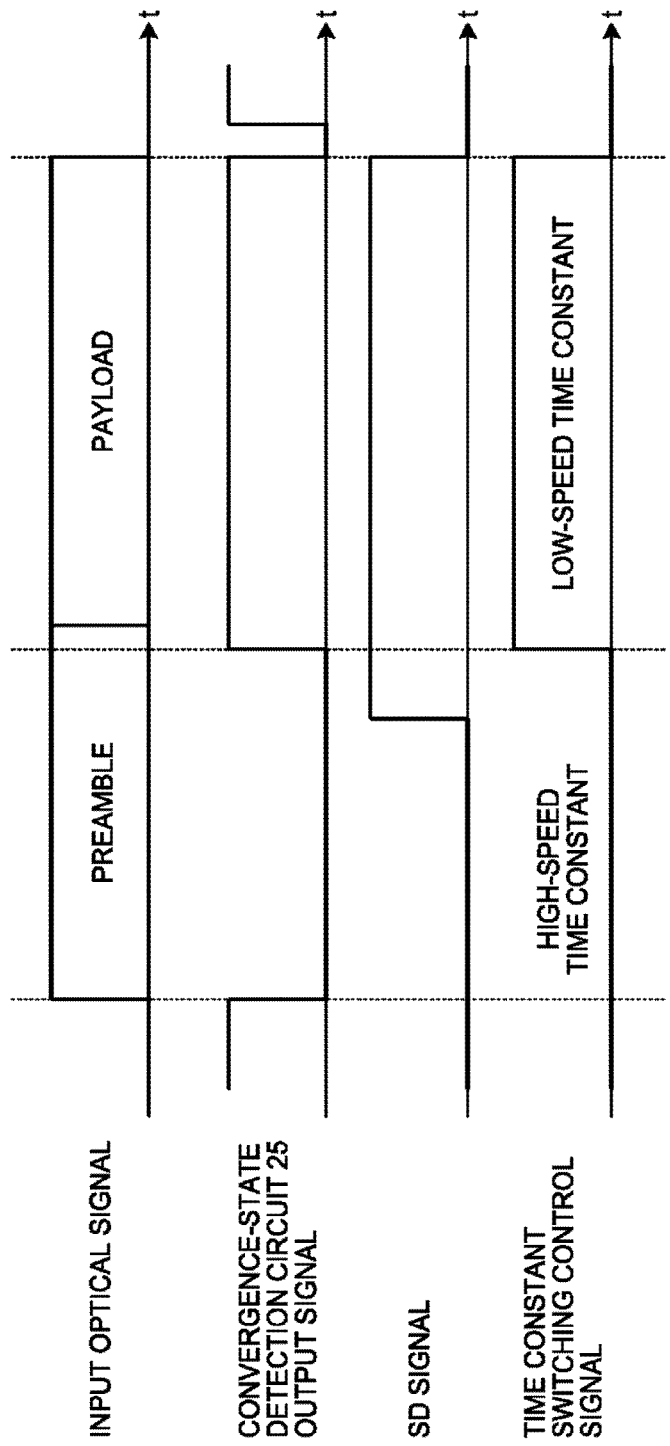
FIG. 14 is a timing chart for explaining the operation of the convergence-state detection circuit in the third embodiment.

FIG. 14 is a timing chart for explaining the operation of the convergence-state detection circuit 25b in this embodiment. FIG. 14 shows, in time series, a relation among an input optical signal to the APD 1, an output signal of the convergence-state detection circuit 25, an SD signal output from the SD 32b, and a time constant switching control signal output by the AND circuit 26.

In the convergence-state detection circuit 25b, the AND circuit 26 calculates an AND of the output signal of the convergence-state detection circuit 25 and the SD signal. Consequently, it is possible to switch the time constant to the low-speed time constant only in a section in which both of the output signal of the convergence-state detection circuit 25 and the SD signal are HIGH, that is, when a change in an AOC output signal is not detected, that is, convergence completion is detected and the SD signal has a value indicating that differential output signals output from the LIA 31 are present. The AND circuit 26 outputs LOW when the time constant is the high-speed time constant and outputs HIGH when the time constant is the low-speed time constant. Consequently, in the optical receiver 10b, it is possible to switch the time constant after both of AOC conversion and SD output are completed irrespective of AOC convergence completion timing and SD output timing, that is, timing when the SD signal is switched from a value indicating that differential output signals output from the LIA 31 are absent to a value indicating that the differential output signals are present. By controlling the time constant switching in synchronization with the AOC 23 and the SD 32b, it is possible to stably realize a normal reception waveform having small waveform distortion. Note that, in FIG. 14, the convergence-state detection circuit 25b outputs LOW when the time constant is the high-speed time constant and outputs HIGH when the time constant is the low-speed time constant. However, this is an example. For example, the convergence-state detection circuit 25b can output HIGH when the time constant is the high-speed time constant and output LOW when the time constant is the low-speed time constant. A NAND circuit can be used for generation of the time constant switching control signal. The convergence-state detection circuit 25 is not limited to this.

As explained above, according to this embodiment, in the optical receiver 10b, not only the AOC output signal but also the output signal of the convergence-state detection circuit synchronized with the SD signal is used as the time constant switching control signal. Consequently, it is possible to switch the time constant from the high-speed time constant to the low-speed time constant after the AOC convergence completion and the SD signal output completion and stably realize a normal reception waveform having small waveform distortion. Note that, in the example explained above, the SD signal is used. However, this is an example. It is also possible to use, instead of the SD signal, other signals similar to the SD signal such as the output signal of the SB 22, that is, other signals with which input of a packet to the APD 1 can be detected.

Note that, in this embodiment, the operation for switching the time constant of the AOC 23 is explained. However, this is an example and the switching of the time constant is not limited to this. When the optical receiver includes an AGC having a time constant switching function instead of the AOC 23, as in this embodiment, it is possible to switch a time constant of the AGC after AGC convergence completion and completion of signal output of an SD signal or a signal similar to the SD signal.

In this embodiment, the example is explained in which the reset signal is not input from the outside. However, when the reset signal is input from the outside and the AOC 23 is initialized, it is also possible to apply the time constant switching operation in this embodiment. In this embodiment, the time constant is switched to the low-speed time constant when a change in the AOC output signal is not detected and the SD signal has the value indicating the differential output signals output from the LIA 31 are present. Therefore, even if the reset signal is input, if a packet is not input, the time constant remains as the high-speed time constant. The time constant switching operation is the same as an example shown in FIG. 14.

Fourth Embodiment

In this embodiment, a circuit configuration including an AOC and an AGC is explained.

Figure 15:
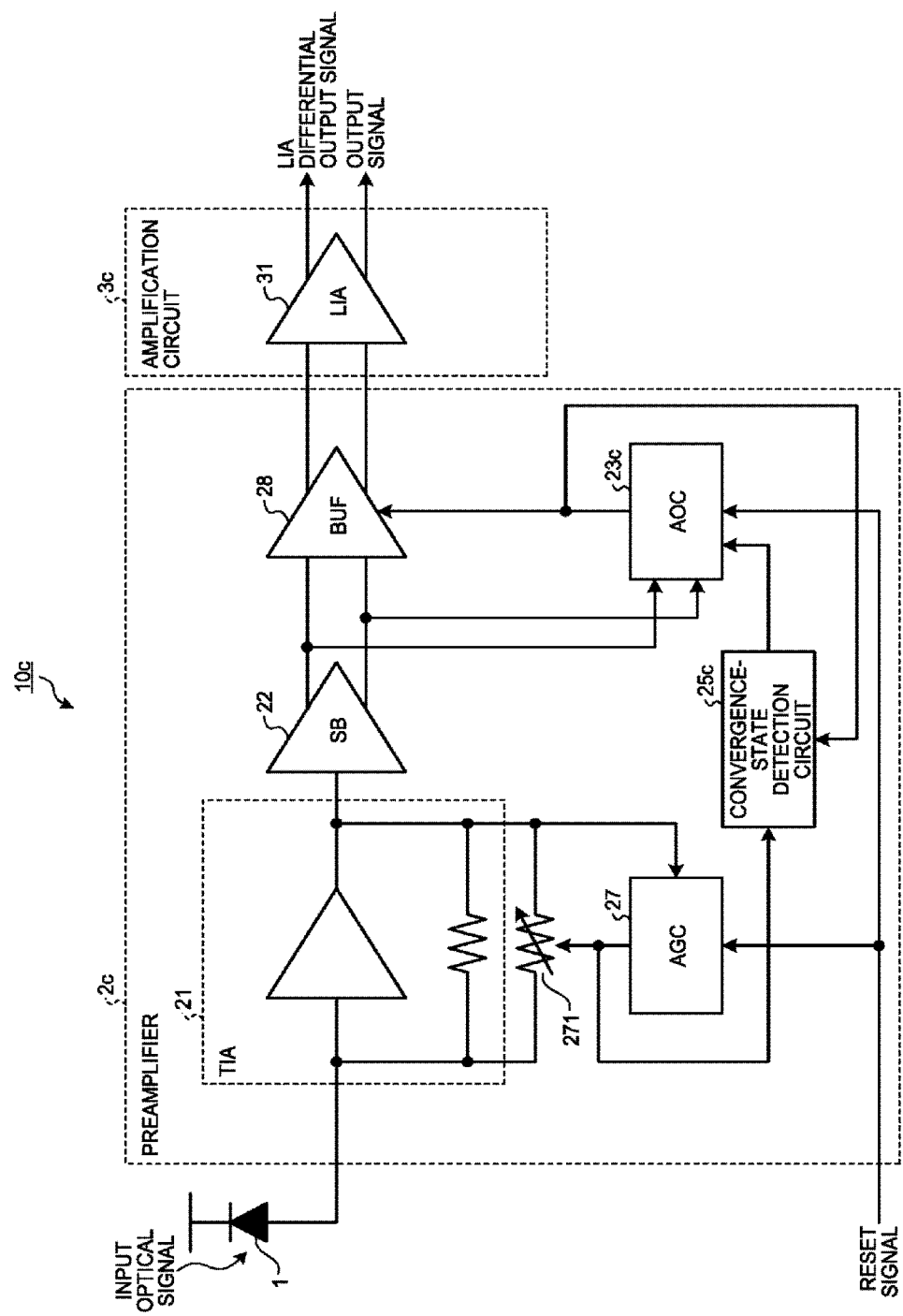
FIG. 15 is a block diagram showing an example of a circuit configuration of an optical receiver in a fourth embodiment.

FIG. 15 is block diagram showing an example of a circuit configuration of an optical receiver 10c in this embodiment. It is assumed that the optical receiver 10c is mounted on an OLT and receives an optical signal from an ONU that configures an optical communication system in conjunction with the OLT. The optical receiver 10c includes the APD 1, a preamplifier 2c that converts a current signal converted by the APD 1 into a voltage signal and output the voltage signal, and an amplification circuit 3c that shapes a waveform of differential output signals output from the preamplifier 2c.

In the preamplifier 2c, an AGC 27 that detects a light reception level of an input optical signal from an output signal of the TIA 21, generates a control signal on the basis of the detected level, controls a variable resistor 271 connected in parallel to a feedback resistor of the TIA 21, and controls a conversion gain of the TIA 21 to an appropriate value is added to the preamplifier 2 in the first embodiment. In the preamplifier 2c, a BUF 28, which is a linear amplifier capable of compensating for an input offset voltage according to a control signal of an AOC 23c that detects an offset voltage of differential output signals of the SB 22, is also added to the preamplifier 2 in the first embodiment. Further, the preamplifier 2c includes an AOC 23c and a convergence-state detection circuit 25c instead of the AOC 23 and the convergence-state detection circuit 25 in the first embodiment. The AGC 27 is an automatic gain control circuit that automatically adjusts the conversion gain of the TIA 21. The AOC 23c has a configuration same as the configuration of the AOC 23 in the first embodiment and switches a time constant on the basis of a time constant switching control signal.

In this embodiment, the AOC 23c and the AGC 27 have independent circuit configurations. The convergence-state detection circuit 25c, which is a detection circuit, receives, as inputs, an AGC output signal from the AGC 27, which is a response of the AGC 27 to the TIA 21 and is a control signal to the TIA 21, and an AOC output signal, which is a response of the AOC 23c to an output signal from the SB 22 and is a control signal to the BUF 28, detects convergence states of the two signals, and performs control for switching a time constant of the AOC 23c. Specifically, the convergence-state detection circuit 25c detects changes of the output signal from the AGC 27 and the output signal from the AOC 23c, which is the response of the AOC 23c to the output signal from the SB 22 and is the control signal to the BUF 28, and detects whether both the signals are in an unchanging state, that is, whether convergence of compensation is completed and convergence of adjustment is completed. When both the signals are in the unchanging state, the convergence-state detection circuit 25c outputs a time constant switching control signal indicating the low-speed time constant. When at least one of both the signals changes, the convergence-state detection circuit 25c outputs a time constant switching control signal indicating the high-speed time constant. The AOC 23c and the AGC 27 require reset signal input from the outside. However, the AOC 23c and the AGC 27 are not limited to this. When a reset signal is not input to the AOC 23c and the AGC 27, temporary switching of the time constant is not caused by the reset signal. Operation other than the temporary switching of the time constant is the same as the operation at the time when the reset signal is input. Note that, in FIG. 15, the AOC 23c, the AGC 27, and the convergence-state detection circuit 25c are incorporated in the preamplifier 2c. However, this is an example. The AOC 23c, the AGC 27, and the convergence-state detection circuit 25c can be incorporated in the amplification circuit 3c or can be provided on the outside of the preamplifier 2c and the amplification circuit 3c.

The amplification circuit 3c is different from the amplification circuit 3 in the first embodiment in that the amplification circuit 3c does not include the SD 32. However, the amplification circuit 3c can include the SD 32 as in the first embodiment. This is an example and the amplification circuit 3c is not limited to this. Note that a circuit configuration of the optical receiver 10c is not limited to the configuration shown in FIG. 15.

Figure 16:
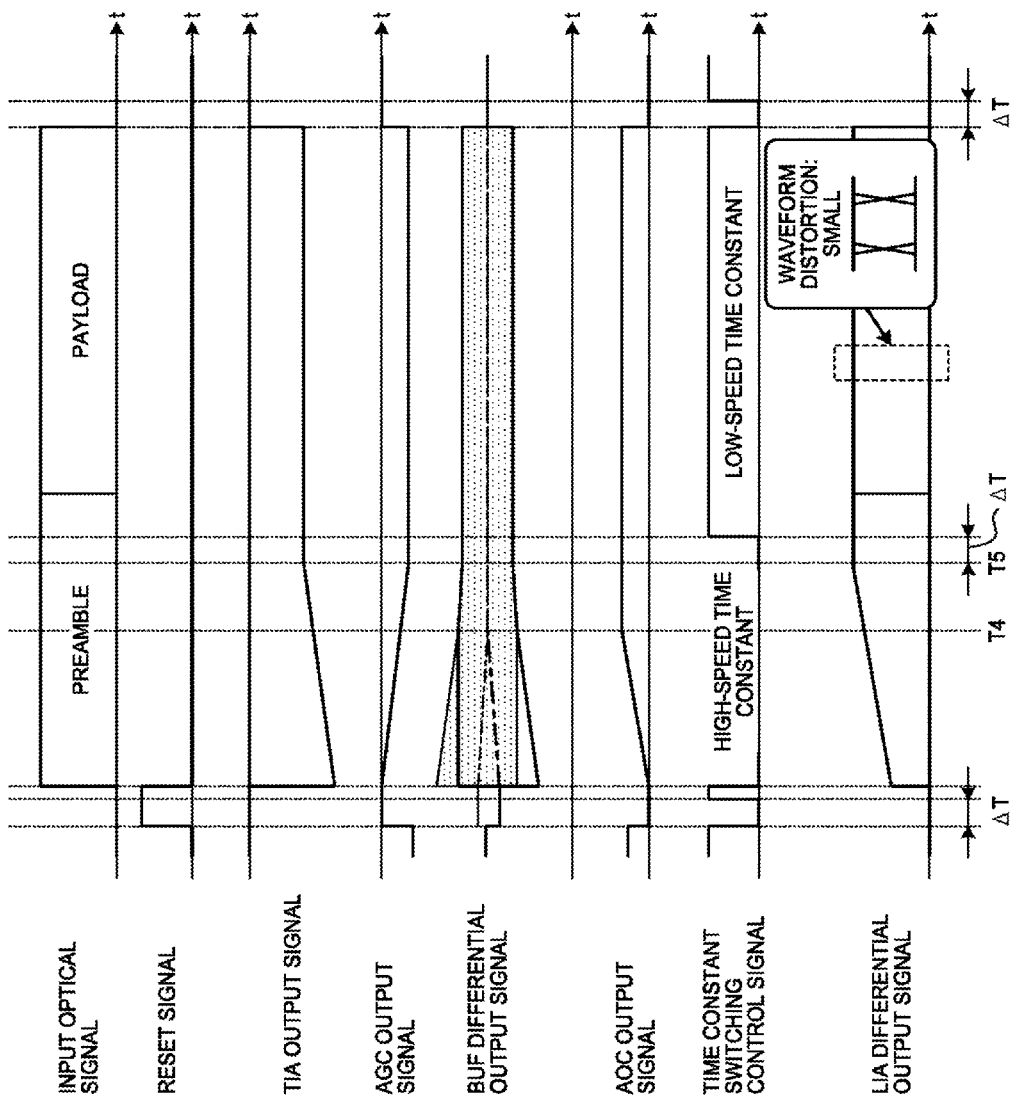
FIG. 16 is a timing chart for explaining time constant switching operation of the optical receiver in the fourth embodiment.

Specific time constant switching operation in the optical receiver 10c is explained in detail with reference to FIG. 16. FIG. 16 is a timing chart for explaining time constant switching operation of the optical receiver 10c in this embodiment. FIG. 16 shows, in time series, a relation among an input optical signal to the APD 1, a reset signal, an output signal of the TIA 21, an output signal of the AGC 27, differential output signals of the BUF 28, an output signal of the AOC 23c, a time constant switching control signal output by the convergence-state detection circuit 25c, and differential output signals of the LIA 31.

A reset signal is input from the outside, whereby output signals of the AOC 23c and the AGC 27 are initialized. Note that, when detecting changes in the output signals due to the initialization of the AOC 23c and the AGC 27, the convergence-state detection circuit 25c once switches the time constant from the low-speed time constant to the high-speed time constant. Thereafter, when a packet is not input, the convergence-state detection circuit 25c switches the time constant from the high-speed time constant to the low-speed time constant. Therefore, a period in which the time constant is the high-speed time constant in a state in which a packet is not input is short. The period does not affect subsequent operation. In FIG. 16, the reset signal is input immediately before input of a preamble, that is, the reset signal has a value for instructing reset immediately before the input of the preamble. However, this is an example. Timing when the reset signal is input is not limited to timing shown in FIG. 16.

After the reset signal input, when a packet is input, the AOC 23c and the AGC 27 respectively start control operations. When detecting convergence of the AOC 23c and the AGC 27 on the basis of changes in output signals from the AOC 23c and the AGC 27, the convergence-state detection circuit 25c switches the time constant switching control signal from HIGH indicating the low-speed time constant to LOW indicating the high-speed time constant and outputs the time constant switching control signal. At this point, because circuits of the AOC 23c and the AGC 27 are independent from each other, required times until convergence completion of the AOC 23c and the AGC 27 are different depending on conditions such as circuit configurations, light reception levels, and offset amounts of the AOC 23c and the AGC 27. In FIG. 16, convergence completion time T4 of the AOC 23c is earlier than convergence completion time T5 of the AGC 27.

When the convergence completion time T5 of the AGC 27 is earlier than the convergence completion time T4 of the AOC 23c, the AOC 23c compensates for an offset of the output signal of the TIA 21, for which the AGC convergence is completed and which has appropriate output amplitude. Consequently, it is possible to realize a normal reception waveform having small waveform distortion. However, as shown in FIG. 16, when the convergence completion time T5 of the AGC 27 is later than the convergence completion time T4 of the AOC 23c, after the AOC convergence completion, the output amplitude of the TIA 21 changes according to the control by the AGC 27. Consequently, an offset occurs between differential output signals of the SB 22 and waveform distortion of the optical receiver 10c increases.

Therefore, in the optical receiver 10c in this embodiment, the convergence-state detection circuit 25c detects a convergence state on the basis of both of the output signals of the AOC 23c and the AGC 27 and switches the time constant of the AOC 23c after convergence of both of the AOC 23c and the AGC 27 is completed. Consequently, it is possible to stably realize a normal reception waveform having small waveform distortion.

Figure 17:
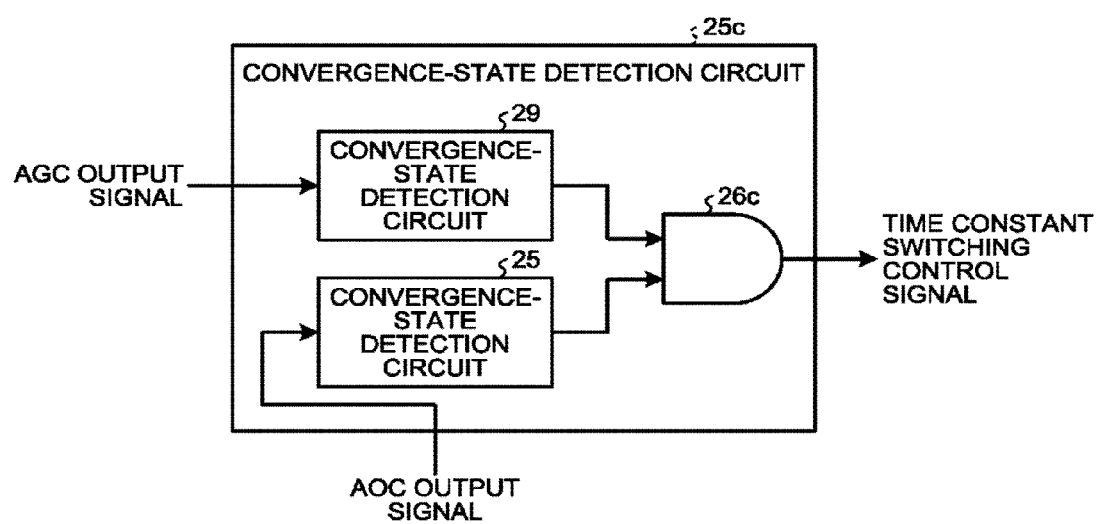
FIG. 17 is a block diagram showing an example of a circuit configuration of a convergence-state detection circuit in the fourth embodiment.

The configuration and the operation of the convergence-state detection circuit 25c are explained in detail with reference to FIGS. 17, 18, and 19. FIG. 17 is a block diagram showing an example of a circuit configuration of the convergence-state detection circuit 25c in this embodiment. The convergence-state detection circuit 25c is a convergence-state detection circuit same as the convergence-state detection circuit in the first embodiment. The convergence-state detection circuit 25c includes the convergence-state detection circuit 25, which is a first circuit, a convergence-state detection circuit 29, which is a second circuit that detects a convergence state of the AGC 27 according to an output signal of the AGC 27, and an AND circuit 26c that receives, as inputs, an output signal of the convergence-state detection circuit 25 and an output signal of the convergence-state detection circuit 29, calculates an AND, and generates a time constant switching control signal of the AOC 23c. The convergence-state detection circuit 29 has, for example, a configuration same as the configuration of the convergence-state detection circuit 25 explained in the first embodiment and receives, as an input, an output signal output from the AGC 27 instead of the AOC output signal. That is, the convergence-state detection circuit 29 has a configuration same as the configuration of a convergence-state detection circuit 25d in a sixth embodiment explained below. An input to the convergence-state detection circuit 29 is the output signal output from the AGC 27. Consequently, the convergence-state detection circuit 29 detects a change in the output signal output from the AGC 27. The convergence-state detection circuit 29 outputs LOW when there is a change in the output signal output from the AGC 27 and outputs HIGH when there is no change in the output signal output from the AGC 27. Consequently, when a change is not detected in both of the AOC output signal and the output signal output from the AGC 27, that is, convergence of the AOC 23c and the AGC 27 is completed, the AND circuit 26c outputs a time constant switching control signal having a value indicating HIGH, that is, the low-speed time constant. Note that the configuration of the convergence-state detection circuit 25c shown in FIG. 17 is an example and is not limited to this.

Figure 18:
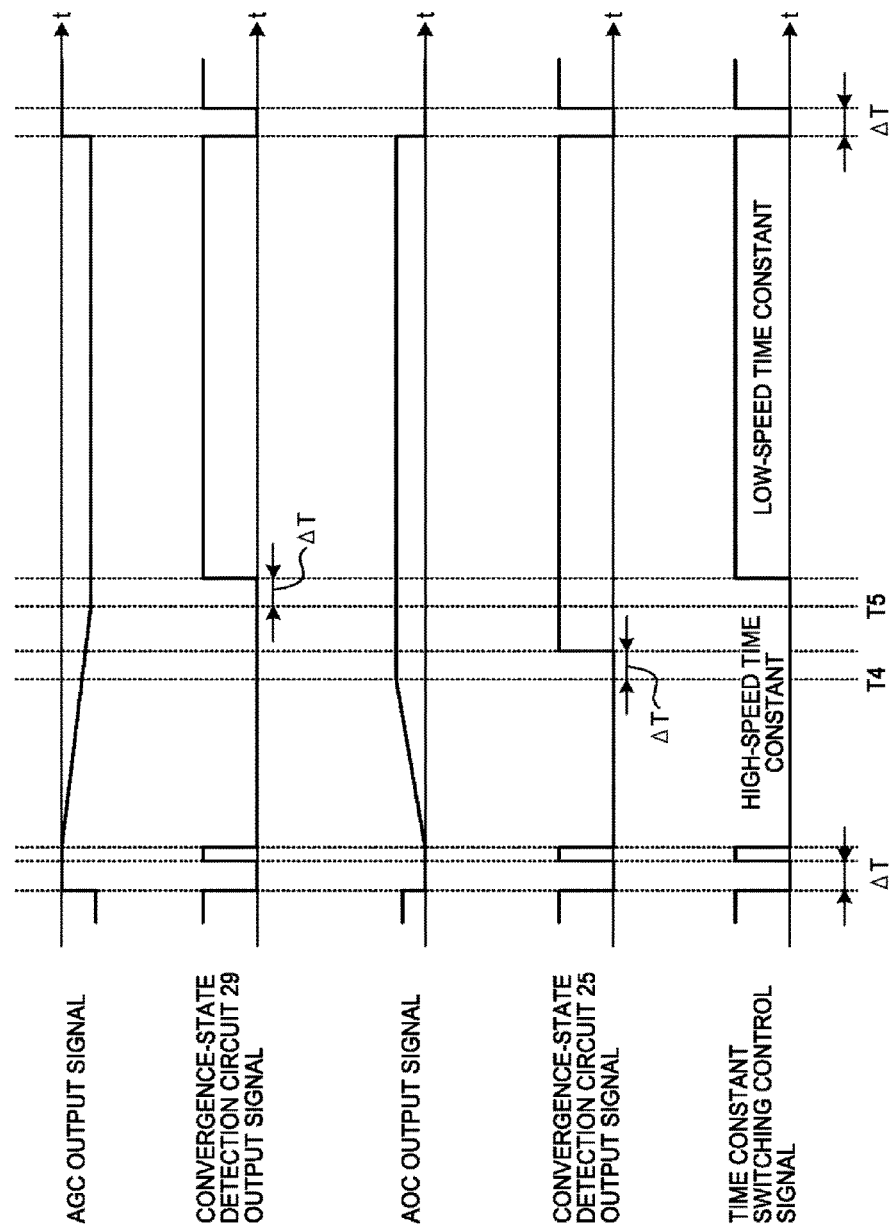
FIG. 18 is a timing chart for explaining the operation of the convergence-state detection circuit at the time when convergence completion time of an AOC is earlier than convergence completion time of an AGC.

FIG. 18 is a timing chart for explaining the operation of the convergence-state detection circuit 25c at the time when the convergence completion time T4 of the AOC 23c is earlier than the convergence completion time T5 of the AGC 27. FIG. 18 shows, in time series, a relation among an output signal of the AGC 27, an output signal of the convergence-state detection circuit 29, an output signal of the AOC 23c, an output signal of the convergence-state detection circuit 25, and a time constant switching control signal output by the AND circuit 26c.

As shown in FIG. 18, when the convergence completion time T4 of the AOC 23c is earlier than the convergence completion time T5 of the AGC 27, the convergence-state detection circuit 25 changes to HIGH at timing of the convergence completion time T4+ΔT, which is timing earlier than timing of the convergence-state detection circuit 29. However, the convergence-state detection circuit 25c calculates an AND of the output signals of the convergence-state detection circuit 25 and the convergence-state detection circuit 29 to change the time constant switching control signal of the AOC 23c to HIGH when both of the output signals are HIGH. Therefore, even if the convergence of the AOC 23c is completed earlier than the convergence of the AGC 27, the AOC 23c maintains the high-speed time constant. The convergence-state detection circuit 25c switches the time constant of the AOC 23c from the high-speed time constant to the low-speed time constant according to the time constant switching control signal at the convergence completion time T5+ΔT when the convergence of the AGC 27 is completed. Consequently, in the optical receiver 10c, by controlling the switching of the time constant in synchronization with the AOC 23c and the AGC 27, it is possible to stably realize a normal reception waveform having small waveform distortion.

Figure 19:
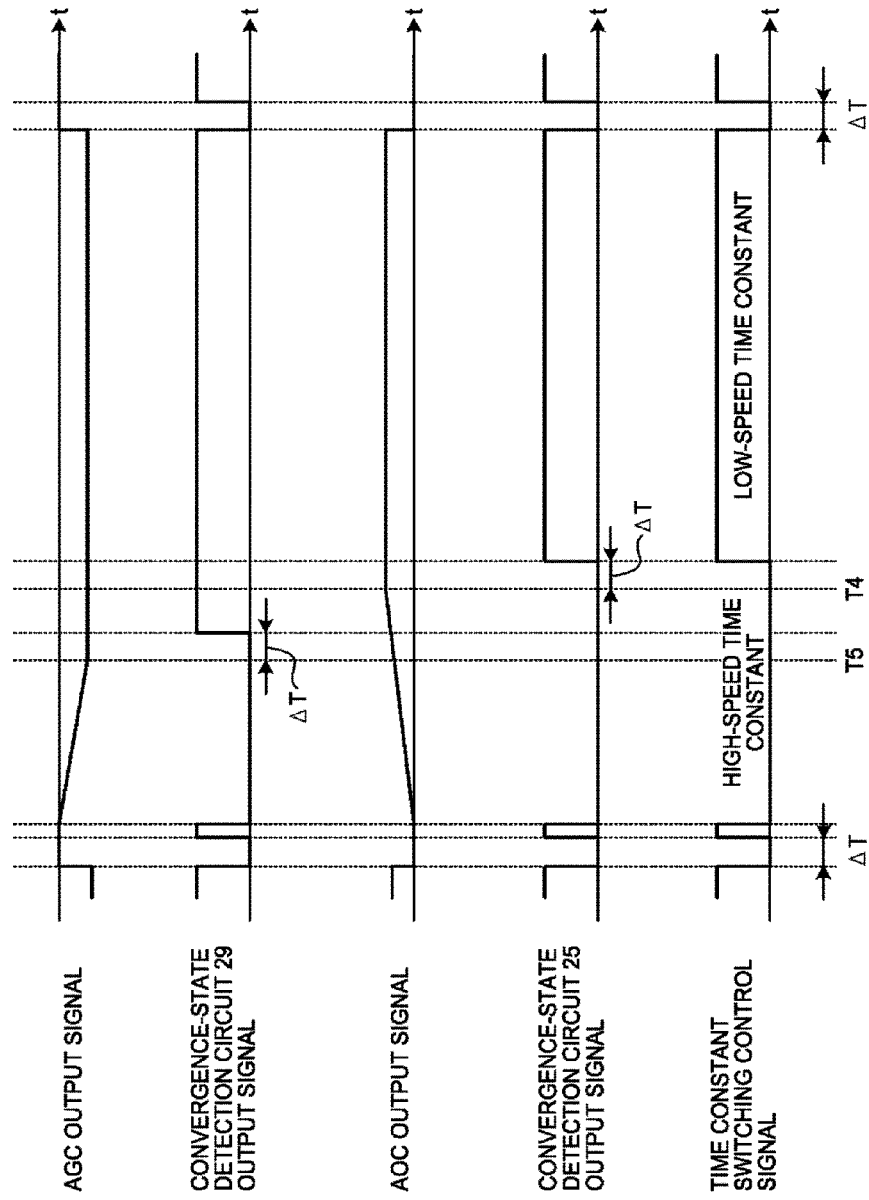
FIG. 19 is a timing chart for explaining the operation of the convergence-state detection circuit at the time when the convergence completion time of the AOC is later than the convergence completion time of the AGC.

FIG. 19 is a timing chart for explaining the operation of the convergence-state detection circuit 25c at the time when the convergence completion time T4 of the AOC 23c is later than the convergence completion time T5 of the AGC 27. FIG. 19 shows, in time series, a relation among an output signal of the AGC 27, an output signal of the convergence-state detection circuit 29, an output signal of the AOC 23c, an output signal of the convergence-state detection circuit 25, and a time constant switching control signal output by the AND circuit 26c.

As shown in FIG. 19, when the convergence completion time T4 of the AOC 23c is later than the convergence completion time T5 of the AGC 27, the output signal of the convergence-state detection circuit 29 changes to HIGH at timing of the convergence completion time T5+ΔT, which is timing earlier than timing of the output signal of the convergence-state detection circuit 25. Even in such a state, the convergence-state detection circuit 25c outputs the time constant switching control signal indicating the high-speed time constant until the convergence of the AOC 23c is completed. The convergence-state detection circuit 25c switches the time constant of the AOC 23c from the high-speed time constant to the low-speed time constant according to the time constant switching control signal at the convergence completion time T4+ΔT after the convergence of both of the AOC 23c and the AGC 27 is completed. Consequently, in the optical receiver 10c, by controlling the switching of the time constant in synchronization with the AOC 23c and the AGC 27, it is possible to stably realize a normal reception waveform having small waveform distortion.

Note that the optical receiver 10c can include the amplification circuit 3b instead of the amplification circuit 3c. In the convergence-state detection circuit 25c, an SD signal can be further input from the SD 32b. As in the third embodiment, it is also possible to perform control for switching the time constant in synchronization with the SD signal. In this case, the convergence-state detection circuit 25c further includes an AND circuit that receives, as inputs, the output signal of the AND circuit 26c and the SD signal, calculates an AND, and generates a time constant switching control signal.

In this embodiment, the control for switching the time constant of the AOC 23c on the basis of the convergence states of the AOC 23c and the AGC 27 is explained. However, the control for switching the time constant is not limited to this. Control for switching the time constant of the AGC 27 on the basis of the convergence states of the AOC 23c and the AGC 27 can be performed. Control for switching time constants of both of the AOC 23c and the AGC 27 on the basis of the convergence states of the AOC 23c and the AGC 27 can be performed.

As explained above, according to this embodiment, in the optical receiver 10c, the output signal of the convergence-state detection circuit 25c synchronized with not only the AOC 23c but also the AGC 27 is used as the time constant switching control signal. Consequently, it is possible to switch the time constant from the low-speed time constant to the high-speed time constant after both of the AOC convergence and the AGC convergence are completed. It is possible to stably realize a normal reception waveform having small waveform distortion.

Fifth Embodiment

In the first embodiment, the example is explained in which the time constant of the AOC 23 is switched after the convergence completion of the control by the AOC 23. An optical receiver sometimes includes not only an AOC but also an AGC as explained above. Both of the AOC and the AGC are types of a voltage control circuit that generates an output signal for controlling a voltage signal output from the TIA 21. The time constant switching control by the AOC explained in the embodiments above can be applied to the AGC, which is the voltage control circuit, as well. In the fifth embodiment, an example is explained in which, when an optical receiver includes an AGC that can perform switching of a time constant, that is, has a time constant switching function, switching of a time constant of the AGC is performed after convergence completion of control by the AGC.

Figure 20:
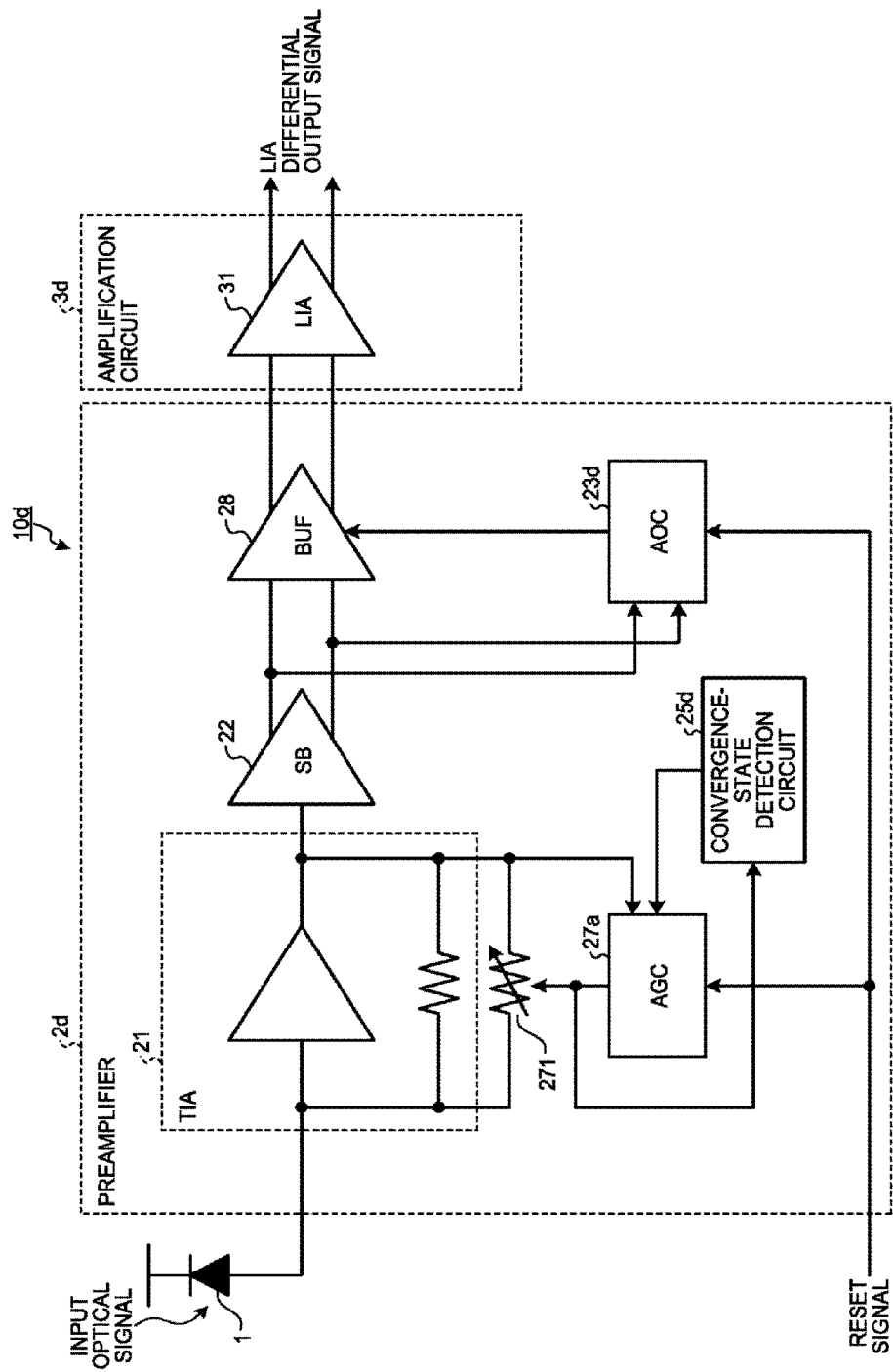
FIG. 20 is a block diagram showing an example of a circuit configuration of an optical receiver in a fifth embodiment.

FIG. 20 is a block diagram showing an example of a circuit configuration of an optical receiver 10d in this embodiment. It is assumed that the optical receiver 10d is mounted on the OLT and receives an optical signal from an ONU that configures an optical system in conjunction with the OLT. The optical receiver 10d includes a preamplifier 2d and an amplification circuit 3d. The configuration of the preamplifier 2d is the same as the configuration of the preamplifier 2 in the first embodiment except that the preamplifier 2d includes the variable resistor 271, an AOC 23d, the BUF 28, an AGC 27a, and a convergence-state detection circuit 25d instead of the AOC 23 and the convergence-state detection circuit 25 of the preamplifier 2 in the first embodiment. The amplification circuit 3d includes the LIA 31 same as the LIA 31 in the first embodiment. The AOC 23d is an auto-offset compensation circuit not including a time constant switching function and controls the BUF 28 on the basis of differential output signals output from the SB 22. The BUF 28 is controlled by an output signal output from the AOC 23d instead of the output signal output from the AOC 23c. Otherwise, the BUF 28 is the same as the BUF 28 in the fourth embodiment. Differences from the first embodiment or the fourth embodiment are explained below. The configuration and the operation in this embodiment other than the points explained below are the same as the configuration and the operation in the first embodiment or the fourth embodiment. The AGC 27a is an automatic gain control circuit that controls a conversion gain of the TIA 21 by controlling a resistance value of the variable resistor 271 connected in parallel to the feedback resistor of the TIA 21. The convergence-state detection circuit 25d, which is a detection circuit, generates and outputs a time constant switching control signal for switching a time constant of the AGC 27a on the basis of presence or absence of a change in an output signal output from the AGC 27a.

Figure 21:
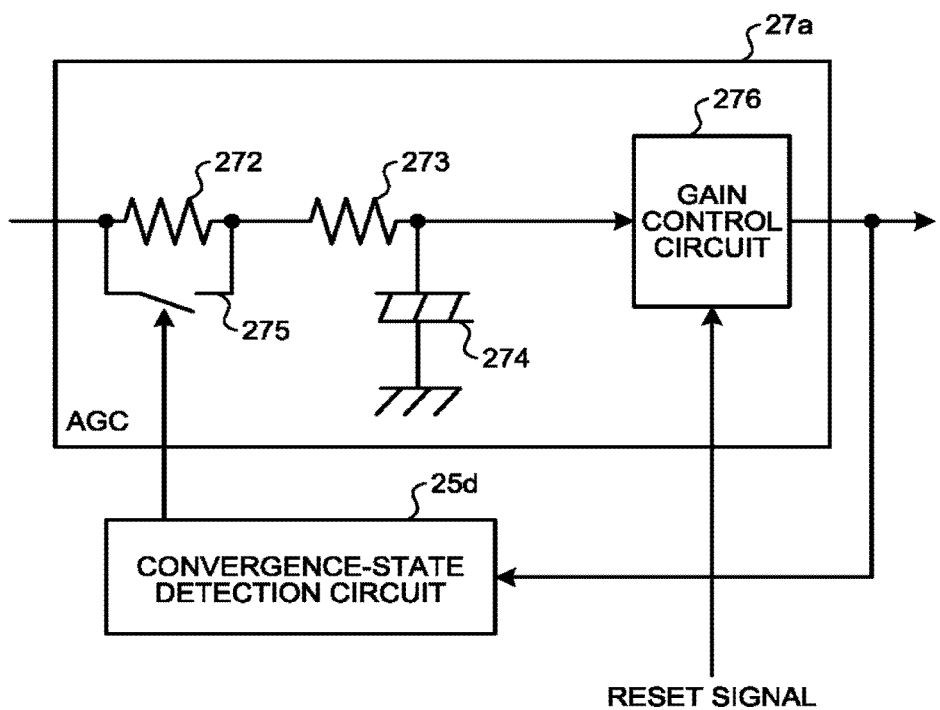
FIG. 21 is a block diagram showing a configuration example of an AGC in the fifth embodiment.

FIG. 21 is a block diagram showing a configuration example of the AGC 27a in this embodiment. The AGC 27a in this embodiment includes a resistor 272 and a resistor 273 and a capacitor 274 configuring an integrator that detects, on the basis of an output signal output from the TIA 21, which is an input signal, an average voltage value of an output signal serving as a direct-current voltage, a time-constant-switching switch unit 275 that is connected in parallel to the resistor 272 and switches an open-circuit state and a short-circuit state on the basis of a time constant switching control signal, and a gain control circuit 276 that outputs, to the variable resistor 271 and the convergence-state detection circuit 25d, an AGC output signal, which is a control signal for controlling the variable resistor 271, generated on the basis of the average voltage value output from the integrator and has an initializing function by a reset signal. The resistors 272 and 273 can have the same resistance value or can have different resistance values. In FIG. 21, a method of detecting, from the output voltage of the TIA 21, a signal that changes according to the input voltage is the integrator configured by the resistors and the capacitor. However, this is an example and the method is not limited to this. Note that the circuit configuration of the AGC 27a is an example. The circuit configuration only has to be a configuration capable of implementing control of different time constants and is not limited to the configuration shown in FIG. 21. In addition, in FIG. 21, the AGC 27a has the initializing function by a reset signal. However, this is an example and the configuration of the AGC 27a is not limited to this.

Figure 22:
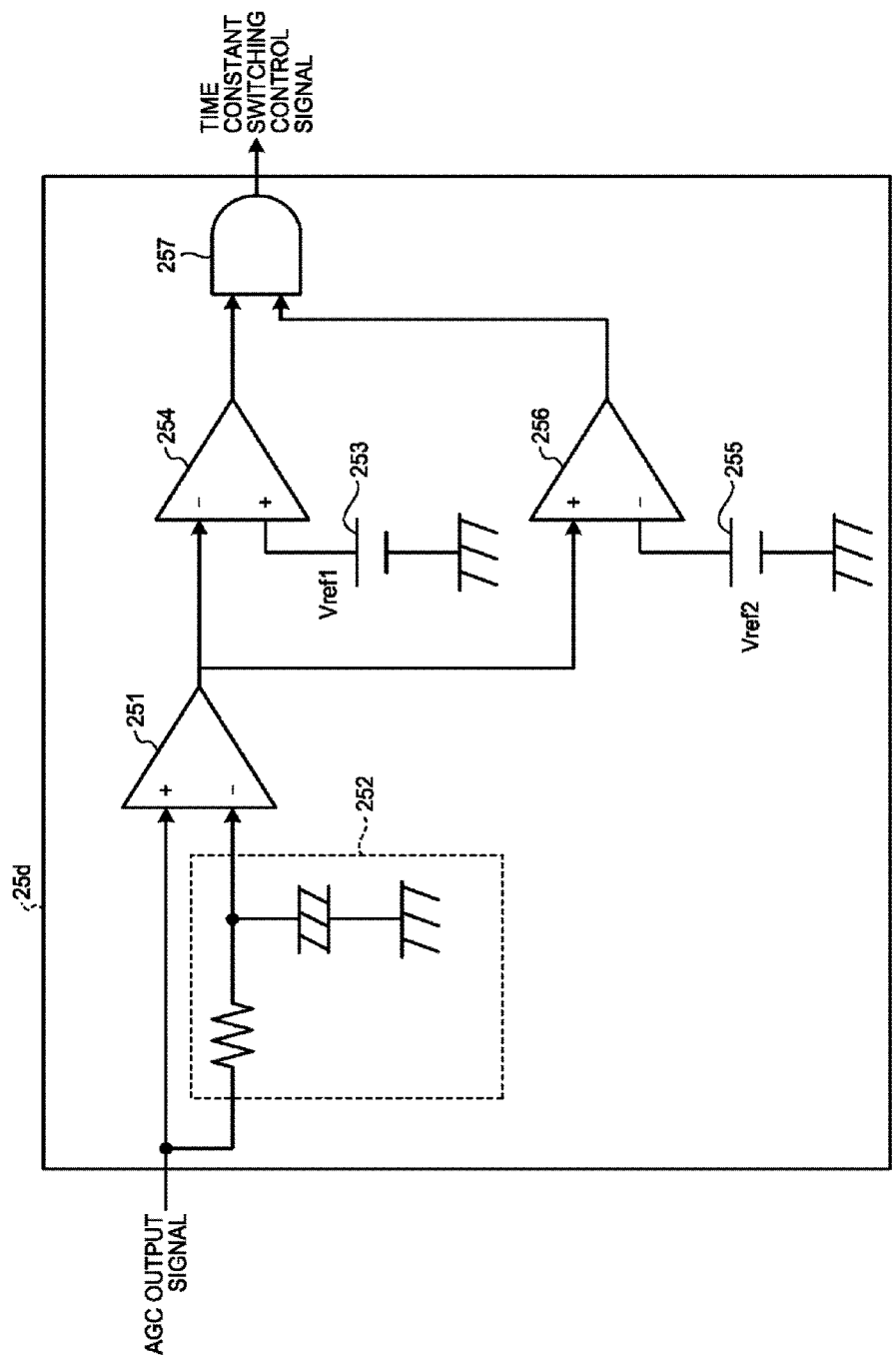
FIG. 22 is a diagram showing a configuration example of a convergence-state detection circuit in the fifth embodiment.

FIG. 22 is a diagram showing a configuration example of the convergence-state detection circuit 25d in this embodiment. The configuration of the convergence-state detection circuit 25d is the same as the configuration of the convergence-state detection circuit 25 explained in the first embodiment. However, the convergence-state detection circuit 25d is different from the convergence-state detection circuit 25 in that the convergence-state detection circuit 25d receives an AGC output signal as an input instead of the AOC output signal. An operation principle of the convergence-state detection circuit 25d is the same as the operation principle of the convergence-state detection circuit 25 in the first embodiment. Therefore, detailed explanation of the operation principle is omitted. Note that values of Vref1 and Vref2 in this embodiment are set for an AGC output signal and can be different from the values of Vref1 and Vref2 in the first embodiment. When there is a change in the AGC output signal output from the AGC 27a, the convergence-state detection circuit 25d outputs LOW indicating the high-speed time constant. When there is no change in the output signal output from the AGC 27a, the convergence-state detection circuit 25d outputs HIGH indicating the low-speed time constant. Polarities of the time constants are difference depending on a circuit configuration and can be reversed. Therefore, the polarities of the time constants are not limited to this.

As in the first embodiment, a voltage output by the high-gain amplifier 251 when a differential voltage of a positive-phase input terminal voltage and a negative-phase input terminal voltage is zero is calculated as a voltage center value Vcg in advance. The reference voltages Vref1 and Vref2 are voltages serving as a first threshold voltage and a second threshold voltage used for determining whether there is a change in the AGC output signal. The reference voltage Vref1 is higher than the voltage center value Vcg and the reference voltage Vref2 is lower than the voltage center value Vcg. When a voltage difference between the AGC output signal and a delay circuit output signal obtained by delaying the AGC output signal by $\Delta T$ is equal to or larger than Vref2 and equal to or smaller than Vref1, the convergence-state detection circuit 25d determines that there is no change in the AGC output signal. When the voltage difference is smaller than Vref2 or larger than Vref1, the convergence-state detection circuit 25d determines that there is a change in the AGC output signal.

Figure 23:
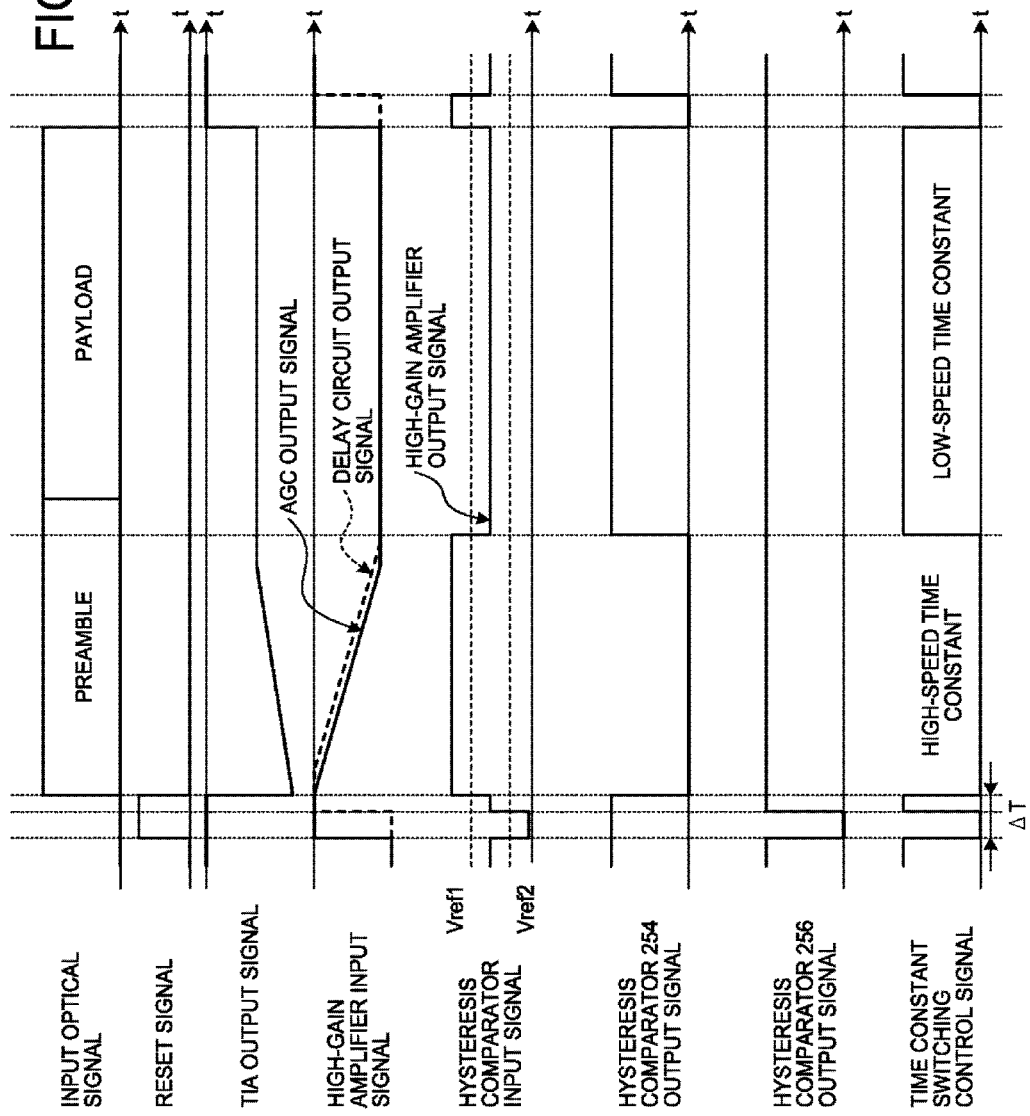
FIG. 23 is a timing chart for explaining time constant switching operation of the optical receiver in the fifth embodiment.

Specific time constant switching operation in the optical receiver 10d is explained using FIG. 23. FIG. 23 is a timing chart for explaining the time constant switching operation of the optical receiver 10d in this embodiment. FIG. 23 shows, in time series, a relation among an input optical signal to the APD 1, a reset signal, an output signal of the TIA 21, a high-gain amplifier input signal, an input signal to the hysteresis comparators 254 and 256, an output signal of the hysteresis comparator 254, an output signal of the hysteresis comparator 256, and a time constant switching control signal output by the convergence-state detection circuit 25d.

As shown in FIG. 23, when reset is instructed by the reset signal, control by the AGC 27a is initialized. Note that, although not shown in FIG. 23, control by the AOC 23d is also initialized. That is, the output signal of the AGC 27a is initialized. Note that, as in the second embodiment, the convergence-state detection circuit 25d detects a change in the AGC output signal due to the initialization of the AGC 27a. The time constant of the AGC 27a is once switched to the high-speed time constant. However, thereafter, because a packet is not input, the time constant is switched to the low-speed time constant. The low-speed time constant is set at a point in time of a packet input start. Therefore, a time period in which the AGC 27a is set to the high-speed time constant in the period in which there is no packet input is short. Deterioration of identical code succession tolerance is little.

In the above explanation, the example is explained in which the reset signal is input from the outside. However, this embodiment and the operation are applicable even when the reset signal is not input. When the reset signal is not input, in the timing chart of FIG. 23, the initialization of the control output signal of the AGC 27a is not performed before the input of the packet. Therefore, the convergence-state detection circuit 25d does not detect a change in the control output signal of the AGC 27a. A temporary period in which the time constant is set to the high-speed time constant does not occur. The other operation at the time when the reset signal is not input is the same as the operation at the time when the reset signal is input.

In FIG. 20, the example is explained in which the optical receiver 10d includes the AOC 23d and the AGC 27a. However, when the optical receiver 10d does not include the AOC 23d, as in the example shown in FIG. 20, it is possible to switch the time constant of the AGC after convergence completion of the control by the AGC.

Figure 24:
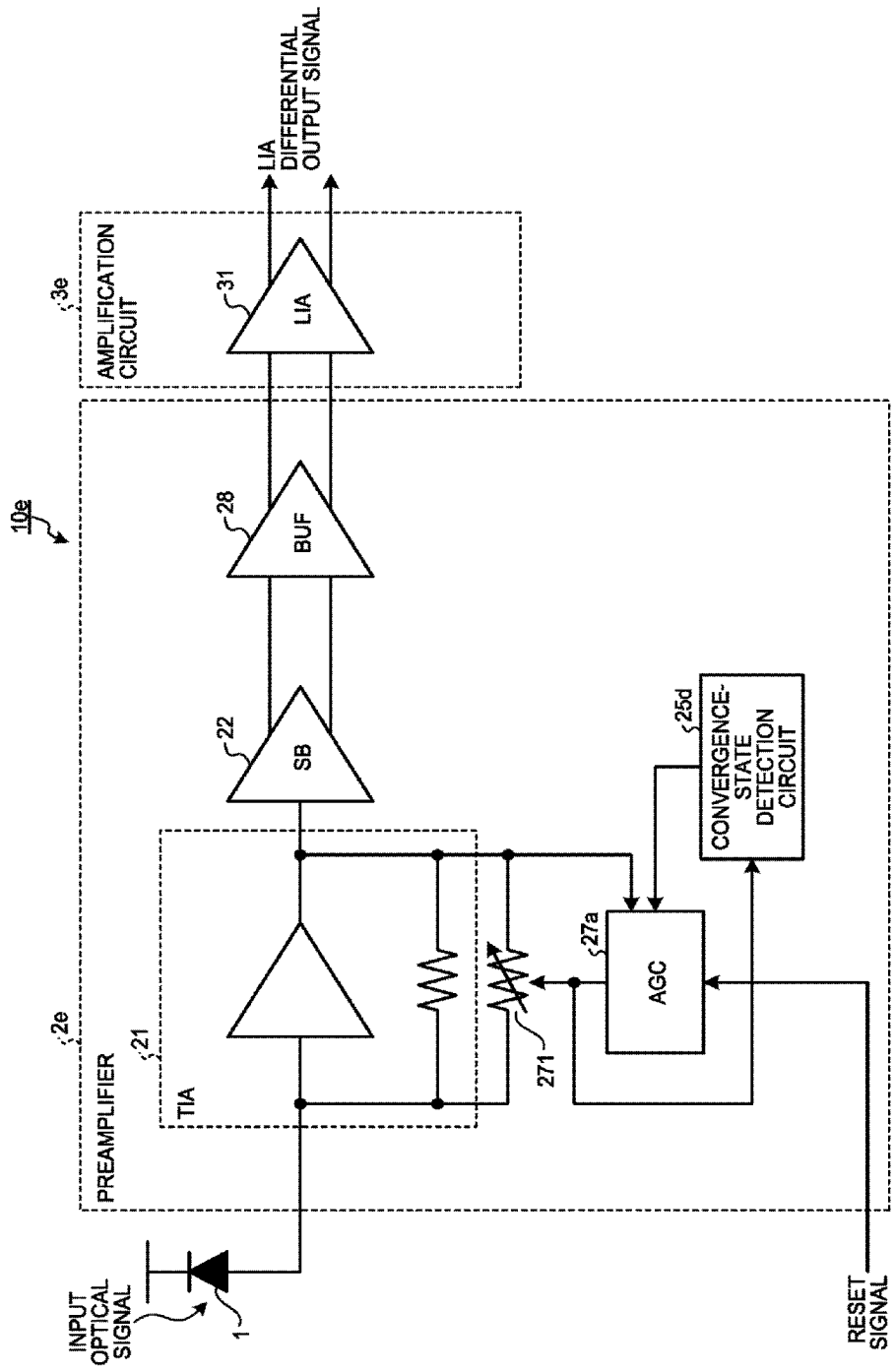
FIG. 24 is a block diagram showing an example of a circuit configuration of an optical receiver not including an AOC in the fifth embodiment.

FIG. 24 is a block diagram showing an example of a circuit configuration of an optical receiver 10e not including the AOC 23d in this embodiment. It is assumed that the optical receiver 10e is mounted on an OLT and receives an optical signal from an ONU that configures an optical communication system in conjunction with the OLT. The optical receiver 10e includes a preamplifier 2e and an amplification circuit 3e. The configuration of the preamplifier 2e does not include the AOC 23d of the preamplifier 2d in the sixth embodiment. Otherwise, the preamplifier 2e is the same as the preamplifier 2d shown in FIG. 20. Time constant switching operation of the optical receiver 10e shown in FIG. 24 is the same as the time constant switching operation of the convergence-state detection circuit 25d in the configuration example shown in FIG. 22.

As explained above, in this embodiment, the time constant of the AGC 27a is switched from the high-speed time constant to the low-speed time constant after the control by the AGC 27a converges. Consequently, the AGC 27a can perform appropriate adjustment of a conversion gain and suppress waveform distortion of a reception waveform.

Figure 25:
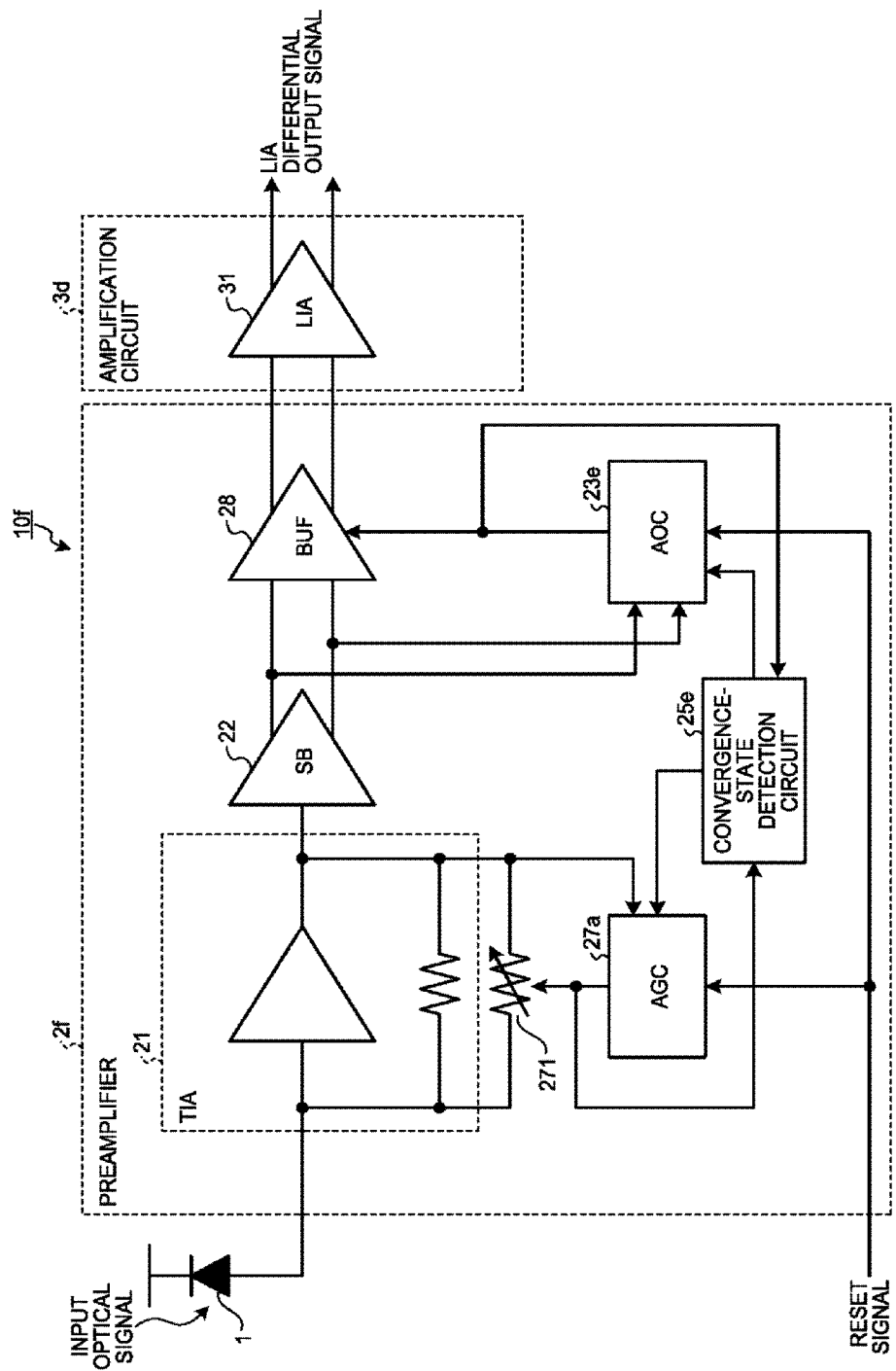
FIG. 25 is a block diagram showing an example of a circuit configuration of an optical receiver that switches time constants of both of the AGO and the AOC in the fifth embodiment.

As a modification, as shown in FIG. 25, in an optical receiver 10f, the AGC 27a has a time constant switching function. Output signals from the AGC 27a and the AOC 23e are input to a convergence-state detection circuit 25e. The optical receiver 10f shown in FIG. 25 includes the amplification circuit 3d and a preamplifier 2f. The amplification circuit 3d is the same as the amplification circuit 3d in the configuration example shown in FIG. 20. Like the convergence-state detection circuit 25c in the fourth embodiment, the convergence-state detection circuit 25e receives output signals from the AGC 27a and the AOC 23e as inputs and outputs a time constant switching control signal. The output time constant switching control signal is input to the AGC 27a and the AOC 23e. The AGC 27a and the AOC 23e shown in FIG. 25 switch the time constant on the basis of the time constant switching control signal, whereby time constants of both of the AGC 27a and the AOC 23c can be switched on the basis of the time-constant switching control signal. Consequently, it is possible to switch the time constants of both of the AGC 27a and the AOC 23e after the control by both of the AGC 27a and the AOC 23e converges. It is possible to suppress waveform distortion of a reception waveform. In the configuration shown in FIG. 25, a reset signal does not have to be input from the outside. In this case, initialization of control output signals of the AGC 27a and the AOC 23e is not performed before input of a packet. Therefore, the convergence-state detection circuit 25e does not detect changes in the control output signals of the AGC 27a and the AOC 23e. A temporary period in which the time constant is set to the high-speed time constant does not occur. The other operation at the time when the reset signal is not input is the same as the operation at the time when the reset signal is input.

In FIG. 25, the time constant switching control signal does not have to be input from the convergence-state detection circuit 25e to the AOC 23e. Consequently, it is possible to switch the time constant of the AGC 27a after the control by both of the AGC 27a and the AOC 23e converges. In this case as well, the reset signal does not have to be input.

Sixth Embodiment

In the third embodiment, the example is explained in which the time constant of the AOC 23 is switched using both of the AOC output signal and the SD signal. However, in this embodiment, an example is explained in which a time constant of an AGC is switched using both of an AGC output signal and an SD signal.

Figure 26:
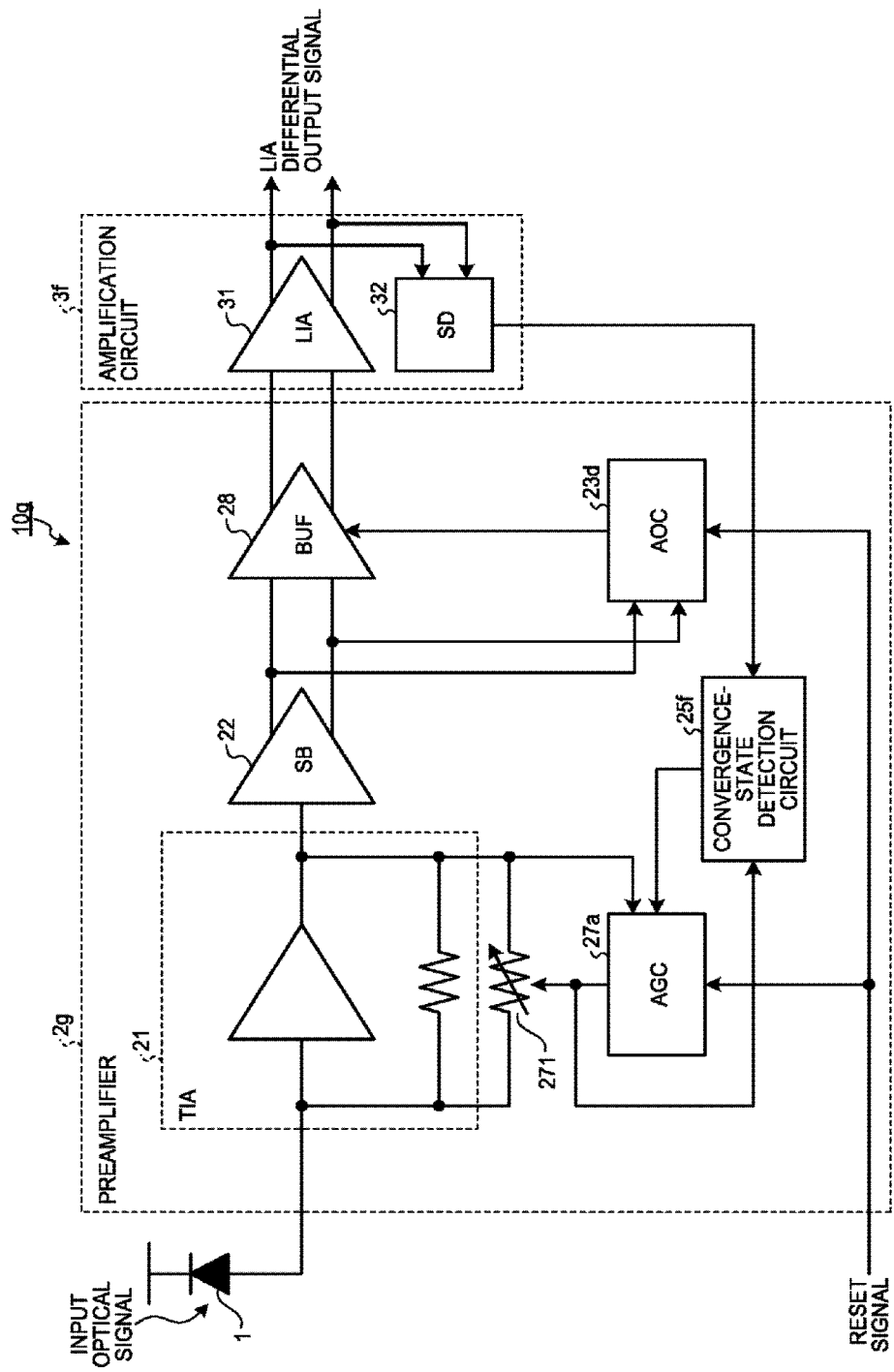
FIG. 26 is a block diagram showing an example of a circuit configuration of an optical receiver in a sixth embodiment.

FIG. 26 is a block diagram showing an example of a circuit configuration of an optical receiver 10g in this embodiment. It is assumed that the optical receiver 10g is mounted on an OLT and receives an optical signal from an ONU that configures an optical communication system in conjunction with the OLT. The optical receiver 10g includes a preamplifier 2g and an amplification circuit 3f. The configuration of the preamplifier 2g is the same as the configuration of the preamplifier 2d in the fifth embodiment except that the preamplifier 2g includes a convergence-state detection circuit 25f, which is a detection circuit, instead of the convergence-state detection circuit 25d in the fifth embodiment. The amplification circuit 3f is the same as the amplification circuit 3b in the third embodiment. Differences from the third embodiment or the fifth embodiment are explained below. The configuration and the operation in this embodiment other than the points explained below are the same as the configuration and the operation in the third embodiment or the fifth embodiment.

The convergence-state detection circuit 25f in this embodiment is different from the convergence-state detection circuit 25b in the third embodiment in that inputs are an AGC output signal and an SD signal. However, a circuit configuration of the convergence-state detection circuit 25f is the same as the circuit configuration of the convergence-state detection circuit 25b. The AGC output signal and the SD signal are input to the convergence-state detection circuit 25f instead of the AOC output signal and the SD signal in the third embodiment. When a change in the AGC output signal is not detected and it is detected by the SD signal that differential output signals output from the LIA 31 are present, the convergence-state detection circuit 25f outputs a value indicating the low-speed time constant as a time constant switching control signal. Otherwise, the convergence-state detection circuit 25f outputs a value indicating the high-speed time constant as the time constant switching control signal.

In the above explanation, the example is explained in which the reset signal is input from the outside. However, as a modification, this embodiment and the operation are applicable even when the reset signal is not input. As in the third embodiment, in this embodiment, the time constant is switched to the low-speed time constant when a change in the AGC output signal is not detected and the SD signal has a value indicating that the differential output signals output from the LIA 31 are present. Therefore, when the reset signal is not input, there is no portion in which the low-speed time constant is temporarily set before packet input. The time constant remains as the high-speed time constant. The other time constant switching operation is the same as the time constant switching operation shown in FIG. 23.

In the configuration shown in FIG. 20 in the fifth embodiment and the various modifications explained in the fifth embodiment, the time constant switching control signal indicating setting of the low-speed time constant can be output when both of detection of convergence completion of at least one of the AGC output signal and the AOC output signal and SD output are satisfied.

Seventh Embodiment

The configurations of the OLT including the optical receiver 10 and the optical communication system including the OLT explained in the first embodiment are explained.

Figure 27:
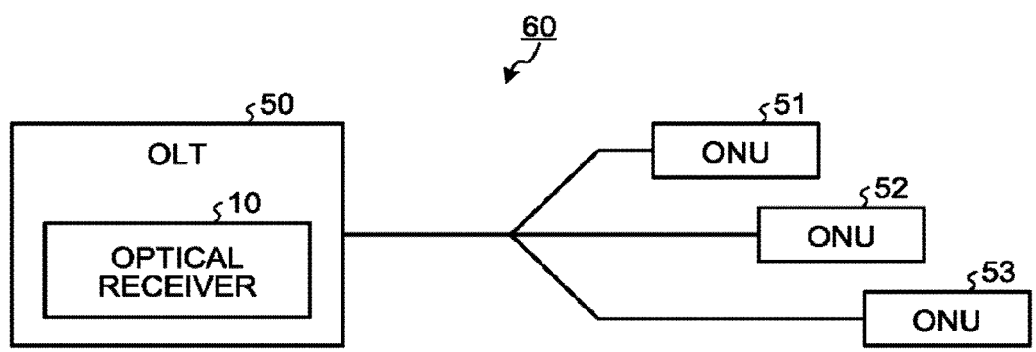
FIG. 27 is a diagram showing a configuration example of an optical communication system in a seventh embodiment.

FIG. 27 is a diagram showing a configuration example of an optical communication system 60 in this embodiment. The optical communication system 60 is configured from an OLT 50 and ONUs 51, 52, and 53. The OLT 50 is connected to the ONUs 51, 52, and 53 via an optical star coupler and an optical fiber, which is a transmission line. The number of ONUs is set to three. However, this is an example and the number of ONUs is not limited to this.

The OLT 50, which is an optical termination device, includes the optical receiver 10. The optical receiver 10 performs the operation such as the auto-offset compensation explained in the first embodiment, whereby, in the OLT 50, concerning optical signals from the ONUs 51, 52, and 53 located at different distances, it is possible to stably realize a normal reception waveform having small waveform distortion. Note that the optical communication system 60 shown in FIG. 27 has a configuration in which the optical receiver 10 is included in the OLT 50. However, the OLT 50 can also include, instead of the optical receiver 10, the optical receivers 10a, 10b, 10c, 10d, 10e, and 10f and the optical receivers of the modifications explained in the embodiments.

REFERENCE SIGNS LIST

1 APD
2, 2a, 2b, 2c, 2d, 2e, 2f, 2g preamplifier 3, 3b, 3c, 3d, 3e, 3f amplification circuit
10, 10a, 10b, 10c, 10d, 10e, 10f optical receiver
21 TIA
22 SB
23, 23a, 23c, 23d AOC
24, 24a current source
25, 25b, 25c, 25d, 25e, 25f, 29 convergence-state detection circuit
26, 26c AND circuit
27, 27a AGC
28 BUF
31 LIA
32, 32b SD
50 OLT
51, 52, 53 ONU
60 optical communication system
251 high-gain amplifier
252 delay circuit
253, 255 reference voltage source
254, 256 hysteresis comparator
257 AND circuit
271 variable resistor

The invention claimed is:
1. An optical receiver comprising:
a photocurrent converter to convert an input optical signal into a current signal;
an amplifier to convert the current signal output from the photocurrent converter into a voltage signal;
a voltage control circuit having a time constant switching function, the voltage control circuit generating an output signal for controlling the voltage signal; and
a detection circuit to, after detecting convergence completion of the voltage control circuit on the basis of the output signal, output, to the voltage control circuit, a time constant switching control signal for switching a time constant of the voltage control circuit from a first time constant to a second time constant larger than the first time constant.

2. The optical receiver according to claim 1, wherein the voltage control circuit initializes the output signal of the voltage control circuit according to a reset signal from an outside.

3. The optical receiver according to claim 1, wherein the detection circuit generates a signal indicating a voltage difference between the output signal and a signal obtained by delaying the output signal by a specified time, when the generated signal is larger than a first threshold voltage or smaller than a second threshold voltage smaller than the first threshold voltage, outputs, to the voltage control circuit, the time constant switching control signal having a first value indicating that the time constant is set to the first time constant, and, when the generated signal is equal to or smaller than the first threshold voltage and equal to or larger than the second threshold voltage, outputs, to the voltage control circuit, the time constant switching control signal having a second value indicating that the time constant is set to the second time constant.

4. The optical receiver according to claim 3, wherein the detection circuit includes:
a delay circuit to generate a delay signal obtained by delaying the output signal by the specified time;
a high-gain amplifier to amplify a difference between the output signal and the delay signal;
a first reference voltage source to generate a first constant voltage signal, a voltage value of which is the first threshold voltage;
a second reference voltage source to generate a second constant voltage signal, a voltage value of which is the second threshold voltage;
a first hysteresis comparator to compare a voltage of an output signal of the high-gain amplifier and a voltage of the first constant voltage signal, determine whether the output signal voltage of the high-gain amplifier is higher, and output a determination result;
a second hysteresis comparator to compare the voltage of the output signal of the high-gain amplifier and a voltage of the second constant voltage signal, determine whether the output signal voltage of the high-gain amplifier is lower, and output a determination result; and
an arithmetic circuit to, when the determination result output from the first hysteresis comparator indicates that the voltage of the output signal of the high-gain amplifier is higher than the first constant voltage signal or when the determination result output from the second hysteresis comparator indicates that the voltage of the output signal of the high-gain amplifier is lower than the second constant voltage signal, output the time constant switching control signal having the first value to the voltage control circuit and, when the determination result output from the first hysteresis comparator indicates that the voltage of the output signal of the high-gain amplifier is equal to or smaller than the first constant voltage signal and the determination result output from the second hysteresis comparator indicates that the voltage of the output signal of the high-gain amplifier is equal to or larger than the second constant voltage signal, output the time constant switching control signal having the second value to the voltage control circuit.

5. The optical receiver according to claim 1, wherein
the amplifier is a first amplifier,
the optical receiver further comprises:
a second amplifier to shape a waveform of a voltage signal output from the first amplifier and output the voltage signal; and
a signal detector to detect presence or absence of a signal output from the second amplifier, and
the detection circuit outputs a time constant switching control signal for switching the time constant of the voltage control circuit from the first time constant to the second time constant to the voltage control circuit after the convergence completion of the voltage control circuit is detected and when the signal detector detects that a signal output from the second amplifier is absent.

6. The optical receiver according to claim 1, wherein the voltage control circuit is an auto-offset compensation circuit that compensates for an offset voltage between differential outputs of the amplifier.

7. The optical receiver according to claim 1, wherein the voltage control circuit is an auto-offset compensation circuit that adjusts a conversion gain of the amplifier.

8. An optical termination device comprising the optical receiver according to claim 1.

9. An optical communication system comprising the optical termination device according to claim 8.

10. An optical receiver comprising:
a photocurrent converter to convert an input optical signal into a current signal;
an amplifier to convert the current signal output from the photocurrent converter into a voltage signal;
an auto-offset compensation circuit having a time constant switching function, the auto-offset compensation circuit outputting a first output signal for compensating for an offset voltage between differential outputs of the amplifier;

an automatic-gain control circuit having the time constant switching function, the automatic-gain control circuit outputting a second output signal for adjusting a conversion gain of the amplifier; and a detection circuit to, after detecting convergence completion of the compensation of the offset voltage in the auto-offset compensation circuit and convergence completion of the adjustment of the conversion gain in the automatic-gain control circuit on the basis of the first output signal and the second output signal, output, to the auto-offset compensation circuit or the automatic-gain control circuit or the auto-offset compensation circuit and the automatic-gain control circuit, a time constant switching control signal for switching a time constant from a first time constant to a second time constant larger than the first time constant.

11. The optical receiver according to claim 10, wherein after detecting the convergence completion of the compensation of the offset voltage in the auto-offset compensation circuit and the convergence completion of the adjustment of the conversion gain in the automatic-gain control circuit on the basis of the first output signal and the second output signal, the detection circuit further outputs, to the automatic-gain control circuit, the time constant switching control signal for switching the time constant from the first time constant to the second time constant larger than the first time constant.

12. The optical receiver according to claim 10, wherein the auto-offset compensation circuit initializes the first output signal according to a reset signal from an outside, and the automatic-gain control circuit initializes the second output signal according to the reset signal.

13. The optical receiver according to claim 10, wherein the control circuit includes:
a first circuit to receive the first output signal as an input and detect a change in the first output signal; and
a second circuit to receive the second output signal as an input and detect a change in the second output signal, and
when the change in the first output signal is not detected by the first circuit and the change in the first output signal is not detected by the second circuit, the detection circuit outputs the time constant switching control signal having a first value indicating that the time constant is set to the first time constant and, when the change in the first output signal is detected by the first circuit or when the change in the first output signal is detected by the second circuit, the detection circuit outputs the time constant switching control signal having a second value indicating that the time constant is set to the second time constant.

14. The optical receiver according to claim 10, wherein the amplifier is a first amplifier,
the optical receiver further comprises:
a second amplifier to shape a waveform of a voltage signal output from the first amplifier and output the voltage signal; and
a signal detector to detect presence or absence of a signal output from the second amplifier, and
the detection circuit outputs a time constant switching control signal for switching the time constant from the first time constant to the second time constant after the convergence completion of the compensation of the offset voltage in the auto-offset compensation circuit and the convergence completion of the adjustment of the conversion gain in the automatic-gain control circuit are detected on the basis of the first output signal and the second output signal and when the signal detector detects that a signal output from the second amplifier is present.

15. An optical receiver comprising:
a photocurrent converter to convert an input optical signal into a current signal;
an amplifier to convert the current signal output from the photocurrent converter into a voltage signal;
an auto-offset compensation circuit to output a first output signal for compensating for an offset voltage between differential outputs of the amplifier;
an automatic-gain control circuit having a time constant switching function, the automatic-gain control circuit outputting a second output signal for adjusting a conversion gain of the amplifier; and
a detection circuit to, after detecting convergence completion of the compensation of the offset voltage in the auto-offset compensation circuit and convergence completion of the adjustment of the conversion gain in the automatic-gain control circuit on the basis of the first output signal and the second output signal, output, to the automatic-gain control circuit, a time constant switching control signal for switching a time constant from a first time constant to a second time constant larger than the first time constant.

16. The optical receiver according to claim 15, wherein the auto-offset compensation circuit initializes the first output signal according to a reset signal from an outside, and the automatic-gain control circuit initializes the second output signal according to the reset signal.

17. The optical receiver according to claim 15, wherein the control circuit includes:
a first circuit to receive the first output signal as an input and detect a change in the first output signal; and
a second circuit to receive the second output signal as an input and detect a change in the second output signal, and
when the change in the first output signal is not detected by the first circuit and the change in the first output signal is not detected by the second circuit, the detection circuit outputs the time constant switching control signal having a first value indicating that the time constant is set to the first time constant and, when the change in the first output signal is detected by the first circuit or when the change in the first output signal is detected by the second circuit, the detection circuit outputs the time constant switching control signal having a second value indicating that the time constant is set to the second time constant.

18. The optical receiver according to claim 15, wherein the amplifier is a first amplifier,
the optical receiver further comprises:
a second amplifier to shape a waveform of a voltage signal output from the first amplifier and output the voltage signal; and
a signal detector to detect presence or absence of a signal output from the second amplifier, and
the detection circuit outputs a time constant switching control signal for switching the time constant from the first time constant to the second time constant after the convergence completion of the compensation of the offset voltage in the auto-offset compensation circuit and the convergence completion of the adjustment of the conversion gain in the automatic-gain control circuit are detected on the basis of the first output signal and the second output signal and when the signal detector detects that a signal output from the second amplifier is present.

19. An optical termination device comprising the optical receiver according to claim 15.

20. An optical communication system comprising the optical termination device according to claim 19.

* * * * *